US010242998B2

(12) United States Patent
Shimura

(10) Patent No.: US 10,242,998 B2
(45) Date of Patent: Mar. 26, 2019

(54) SEMICONDUCTOR MEMORY DEVICE HAVING A LAMINATED BODY INCLUDING A PLURALITY OF CONTROL GATE ELECTRODES LAMINATED IN A FIRST DIRECTION

(71) Applicant: Toshiba Memory Corporation, Minato-ku (JP)

(72) Inventor: Yasuhiro Shimura, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 106 days.

(21) Appl. No.: 15/248,336

(22) Filed: Aug. 26, 2016

(65) Prior Publication Data
US 2017/0271357 A1    Sep. 21, 2017

Related U.S. Application Data

(60) Provisional application No. 62/308,484, filed on Mar. 15, 2016.

(51) Int. Cl.
| | |
|---|---|
| *G11C 16/04* | (2006.01) |
| *H01L 27/11582* | (2017.01) |
| *H01L 27/1157* | (2017.01) |
| *H01L 27/11573* | (2017.01) |
| *G11C 16/10* | (2006.01) |
| *G11C 16/26* | (2006.01) |

(52) U.S. Cl.
CPC .... *H01L 27/11582* (2013.01); *G11C 16/0483* (2013.01); *G11C 16/10* (2013.01); *G11C 16/26* (2013.01); *H01L 27/1157* (2013.01); *H01L 27/11573* (2013.01)

(58) Field of Classification Search
CPC ........................................................ G11C 16/10
USPC .................................................... 365/185.18
See application file for complete search history.

(56) References Cited

U.S. PATENT DOCUMENTS

| | | | |
|---|---|---|---|
| 8,674,426 B2 | 3/2014 | Higuchi et al. | |
| 8,946,023 B2 | 2/2015 | Makala et al. | |
| 2013/0248965 A1* | 9/2013 | Nakai | H01L 29/788 257/315 |
| 2015/0001460 A1 | 1/2015 | Kim et al. | |

FOREIGN PATENT DOCUMENTS

JP    2011-165815    8/2011

* cited by examiner

*Primary Examiner* — Hoai V Ho
(74) *Attorney, Agent, or Firm* — Oblon, McClelland, Maier & Neustadt, L.L.P.

(57) ABSTRACT

A plurality of semiconductor layers have longitudinally a first direction, have a peripheral area surrounded by the plurality of control gate electrodes, and are arranged in a plurality of rows within the laminated body. A controller controls a voltage applied to the control gate electrodes and bit lines. The controller, during a writing operation, applies a first voltage to a first bit line connected to the semiconductor layer positioned in a first row closer to the insulation separating layer, and applies a second voltage larger than the first voltage to a second bit line connected to the semiconductor layer positioned in a second row positioned further from the insulation separating layer with respect to the first row, among the plurality of rows.

6 Claims, 22 Drawing Sheets

D1>D2

PROGRAM { V1=V4=0V
V2=V3=ΔVBLC
INHIBIT { V1=V2=V3=V4=VDD

Read @ WL23 $\begin{cases} Tsense1=Tsense4=T1+\Delta T23 \\ Tsense2=Tsense3=T1 \end{cases}$ Read @ WL0 $\begin{cases} Tsense1=Tsense4=T2+\Delta T0 \\ Tsense2=Tsense3=T2 \end{cases}$ $(T23 > \Delta T0)$

SEMICONDUCTOR MEMORY DEVICE HAVING A LAMINATED BODY INCLUDING A PLURALITY OF CONTROL GATE ELECTRODES LAMINATED IN A FIRST DIRECTION

This application is based on and claims the benefit of priority from prior US prior provisional Patent Application No. 62/308,484, filed on Mar. 15, 2016, the entire contents of which are incorporated herein by reference.

FIELD

Embodiments described herein relate generally to a semiconductor memory device.

BACKGROUND

Description of the Related Art

There has been known a flash memory that accumulates electric charges on an electric charge accumulating layer to store data. Such flash memory is connected by various methods such as a NAND type and a NOR type, thus constituting a semiconductor memory device. Recently, a semiconductor memory device whose memory cells are three-dimensionally disposed (three-dimensional semiconductor memory device) has been proposed to obtain high integration.

DETAILED DESCRIPTION

Figure 1:
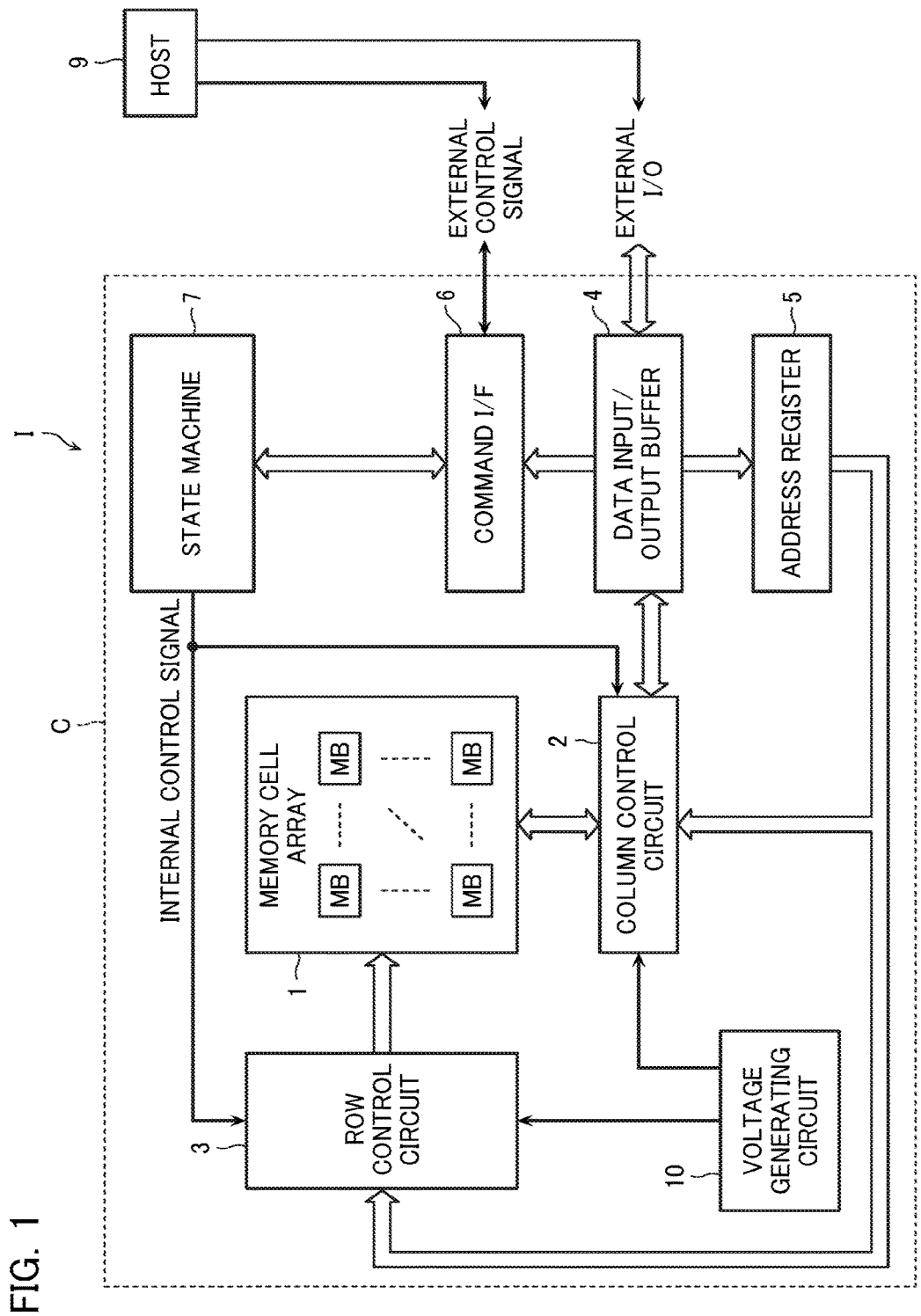
FIG. 1 is a block diagram of a non-volatile semiconductor memory device according to a first embodiment.

According to one embodiment, a semiconductor memory device includes a laminated body that include a plurality of control gate electrodes laminated in a first direction and have longitudinally a second direction intersecting with the first direction. An insulation separating layer is arranged along the laminated body, and has longitudinally the second direction. A plurality of semiconductor layers have longitudinally the first direction, have a peripheral area surrounded by the plurality of control gate electrodes, and are arranged in a plurality of rows within the laminated body. A memory insulating layer is disposed between the control gate electrodes and one of the semiconductor layers, and includes an electric charge accumulating layer. A plurality of bit lines are connected to one ends of the semiconductor layers, respectively, and extends in a third direction intersecting with the first and second directions. A controller controls a voltage applied to the control gate electrodes and the bit lines. The controller, during a writing operation, applies a first voltage to a first bit line connected to the semiconductor layer positioned in a first row closer to the insulation separating layer, and applies a second voltage larger than the first voltage to a second bit line connected to the semiconductor layer positioned in a second row positioned further from the insulation separating layer with respect to the first row, among the plurality of rows.

In this semiconductor memory device, the controller, during a reading operation, applies the first voltage to the first bit line connected to the semiconductor layer positioned in the first row closer to the insulation separating layer, and applies the second voltage smaller than the first voltage to the second bit line connected to the semiconductor layer positioned in the second row positioned further from the insulation separating layer with respect to the first row, among the plurality of rows.

Next, a non-volatile semiconductor memory device according to the embodiments will be described in detail with reference to the drawings. These embodiments are merely one example, and are not described for the purpose of limiting the present invention.

For example, the non-volatile semiconductor memory device described below includes a plurality of memory cells (memory transistors) arranged in a first direction intersecting with a top surface of a substrate. These memory cells extend to the above-described first direction, and have a semiconductor layer serving as a channel body and a control gate electrode disposed on a side surface of the semiconductor layer via a memory gate insulating layer.

These plurality of memory cells are connected to one another in series to constitute a memory string. One memory string may have one semiconductor layer, or may have two or more semiconductor layers connected at one end (lower end).

The above-described memory cell may be a Metal-Oxide-Nitride-Oxide-Semiconductor (MONOS) type memory cell, which has an electric charge accumulating layer constituted of nitride and the control gate electrode made of metal, or may be a Semiconductor-Oxide-Nitride-Oxide-Semiconductor (SONOS) type memory cell, which has the control gate electrode made of semiconductor.

The above-described memory gate insulating layer may include a floating gate, not the electric charge accumulating layer constituted of nitride.

The respective drawings of the non-volatile semiconductor memory device used in the following embodiments are schematically illustrated. The thickness, the width, the ratio, and a similar parameter of the layer are not necessarily identical to actual parameters.

First Embodiment

Configuration of Semiconductor Memory Device

FIG. 1 is a block diagram of a non-volatile semiconductor memory device according to a first embodiment. Here, the non-volatile semiconductor memory device means, for example, a chip C, which stores user data, an electronic device I, which includes therein this chip C (such as a smart phone, a mobile phone, a tablet terminal, a music player and a wearable terminal), and similar device. User data is data that expresses, for example, contents used by a user (such as character string data, audio data, image data and moving image data), which are expressed by combinations of "0" and "1."

The electronic device I includes the chip C and a host 9, which controls this chip C. The chip C includes a memory cell array 1, and a column control circuit 2, a row control circuit 3, a data input/output buffer 4, an address register 5, a command interface 6, a state machine 7, and a voltage generation circuit 10 which control this memory cell array 1.

The memory cell array 1 includes a plurality of memory blocks MB. These memory blocks MB each store user data.

The column control circuit 2 includes a sense amplifier (not shown), and performs reading of the user data or similar operation. The column control circuit 2 transfers a voltage to the memory cell array 1 corresponding to the input user data when performing writing of the user data.

The row control circuit 3 specifies a position where the user data is read from and written to inside the memory cell array 1 corresponding to input address data.

The data input/output buffer 4 performs input/output control of the user data, the address data, and command data. The address register 5 keeps the address data, and supplies the address data to the column control circuit 2 and the row control circuit 3. The state machine 7 accepts an external control signal from the host 9 via the command interface 6, and inputs an internal control signal to the column control circuit 2 and the row control circuit 3.

The voltage generation circuit 10 generates a voltage, and supplies the voltage to the column control circuit 2 and the row control circuit 3.

Figure 2:
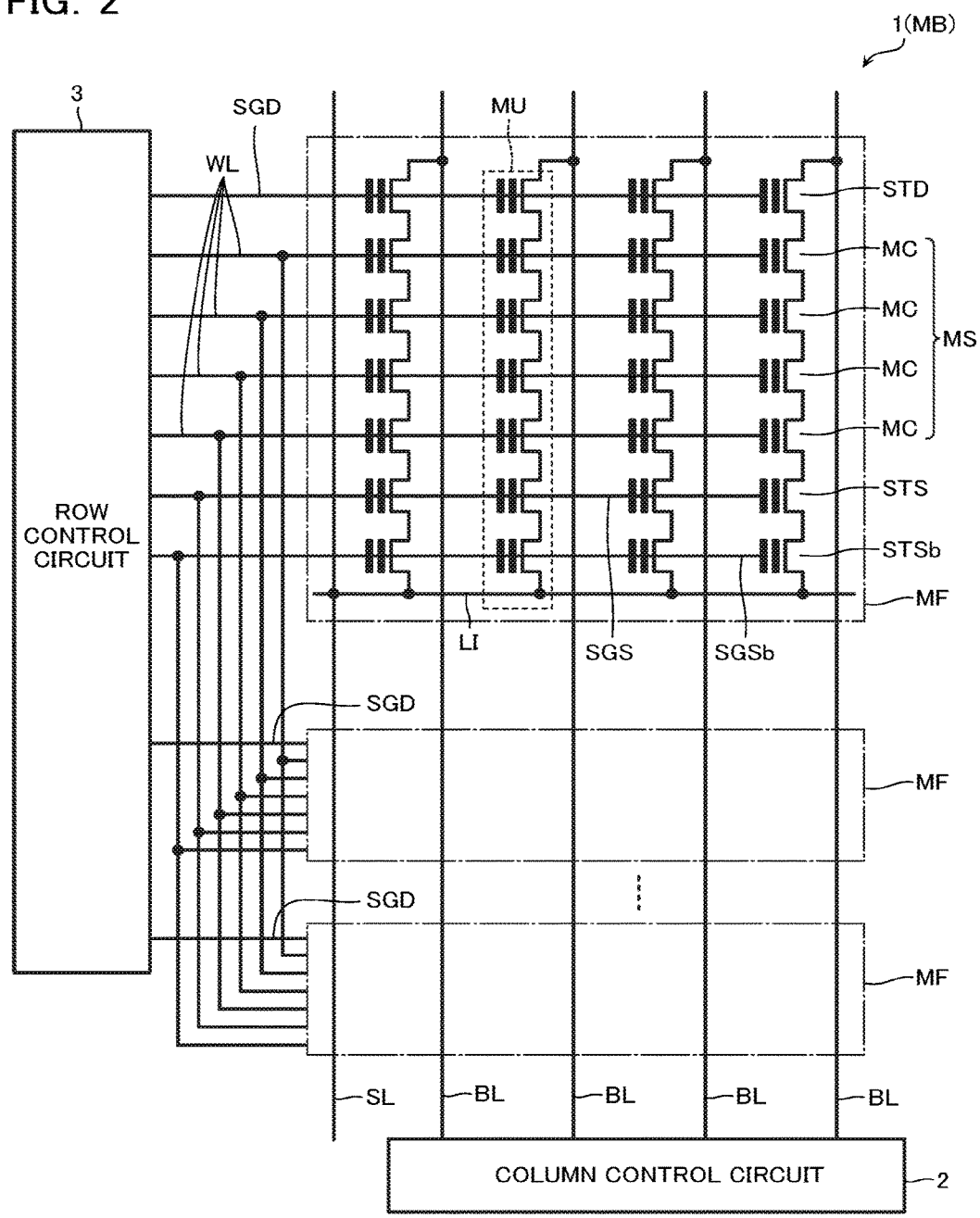
FIG. 2 is a circuit diagram illustrating a part of a configuration of the non-volatile semiconductor memory device according to the first embodiment.

FIG. 2 is an equivalent circuit diagram illustrating a configuration of the memory block MB that constitutes the memory cell array 1. The memory block MB is connected to the column control circuit 2 via bit lines BL, the row control circuit 3 via a word lines WL, and a source line driver (not shown) via a source line SL.

The memory block MB includes a plurality of memory fingers MF. The memory finger MF includes a plurality of memory units MU. One ends of these plurality of memory units MU are connected to the respective bit lines BL. The other ends of these plurality of memory units MU are each connected to the source line SL via a common source contact LI. The memory unit MU includes a drain side selection gate transistor STD, a memory string MS, a source side selection gate transistor STS, and a lowermost layer source side selection gate transistor STSb, which are connected in series between the bit line BL and the source contact LI.

The memory string MS includes a plurality of memory cells MC connected in series. The memory cell MC is a semiconductor layer that serves as a channel body, a memory gate insulating layer, which can accumulate an electric charge, and a field-effect type transistor, which includes a control gate electrode. The memory cell MC stores one bit or plural bits of data, which constitute the user data. A threshold voltage of memory cell MC varies corresponding to an electric charge amount inside the memory gate insulating layer. The control gate electrodes of the plurality of memory cells MC, which belong to an identical memory string MS, are connected to the respective word lines WL. The word lines WL are disposed commonly for all of the memory strings MS in the memory block MB.

The drain side selection gate transistor STD, the source side selection gate transistor STS, and the lowermost layer source side selection gate transistor STSb are field-effect type transistors, which include a semiconductor layer serving as a channel body and a control gate electrode. The control gate electrodes of the drain side selection gate transistor STD, the source side selection gate transistor STS, and the lowermost layer source side selection gate transistor STSb are connected to a drain side selection gate line SGD, a source side selection gate line SGS, and a lowermost layer source side selection gate line SGSb, respectively.

The lowermost layer source side selection gate transistor STSb, the source side selection gate transistor STS, and the drain side selection gate transistor STD may be simply referred to as selection gate transistors (STSb, STS, STD) in the following description. Similarly, the lowermost layer source side selection gate line SGSb, the source side selection gate line SGS, and the drain side selection gate line SGD may be simply referred to as selection gate lines (SGSb, SGS, SGD).

Figure 3:
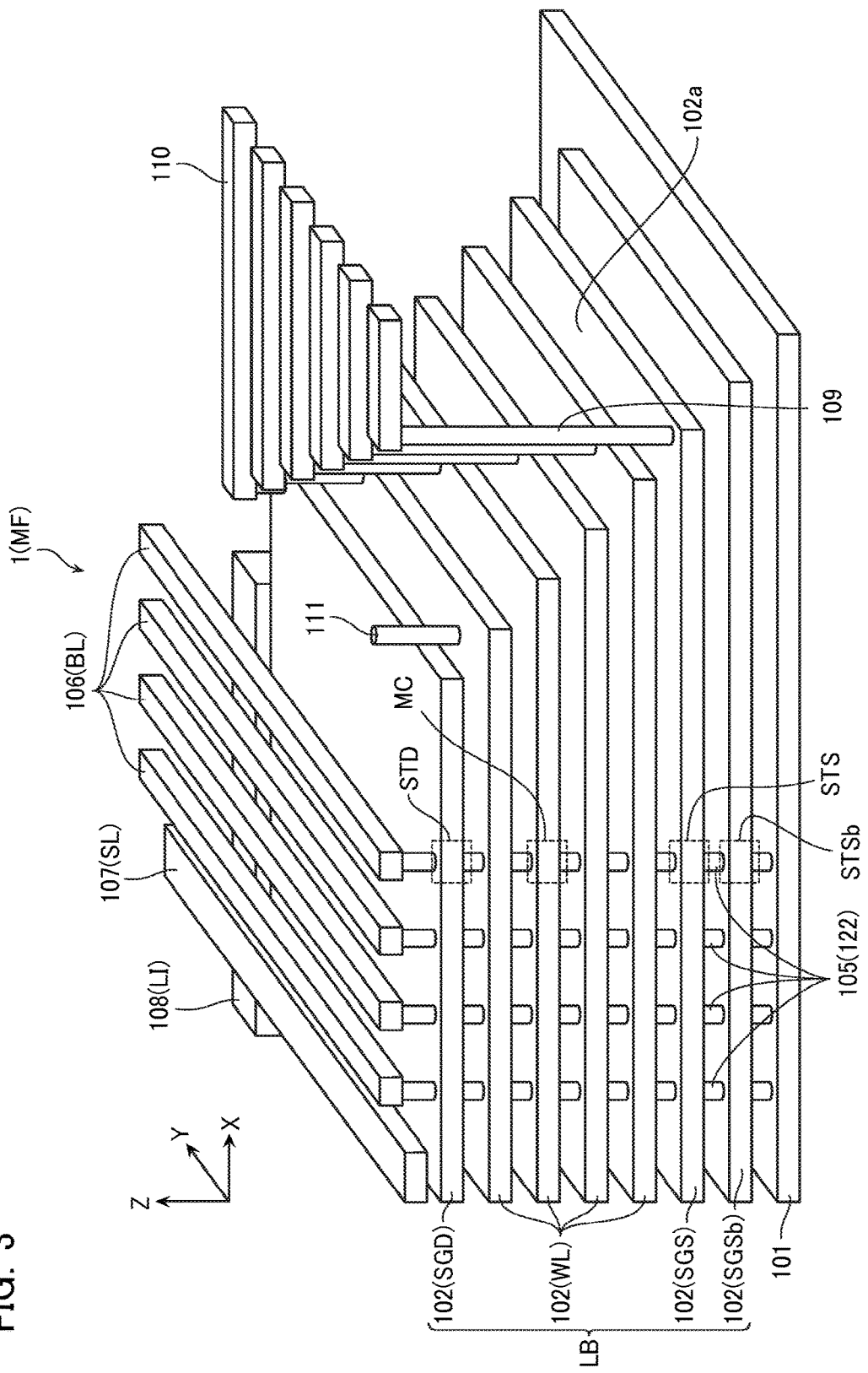
FIG. 3 is a perspective view illustrating apart of the configuration of the non-volatile semiconductor memory device according to the first embodiment.

FIG. 3 is a perspective view schematically illustrating a configuration of a part of the memory finger MF. FIG. 3 is for describing a three-dimensional structure of wirings, memory cells MC and similar part. Interlayer insulating layers, which are disposed between the wirings and similar parts, are not illustrated. FIG. 3 is illustrated for a description and a specific configuration is changeable as necessary. In the following description, a predetermined direction that is parallel with respect to a top surface of a substrate 101 is an X direction, a direction that is parallel with respect to the top surface of the substrate 101 and perpendicular to the X direction is a Y direction, and a direction that is perpendicular with respect to the top surface the substrate 101 is a Z direction. Although the following description illustrates a direction to which the memory string MS extends (a first direction) corresponds to the Z direction as one example, the first direction does not necessarily correspond to the Z direction.

The memory finger MF includes the substrate 101, a laminated body LB disposed above the substrate 101, and memory shafts 105 in an approximately column-shape covered with the laminated body LB on side surfaces.

The substrate 101 is a semiconductor substrate constituted of, for example, single-crystal silicon (Si). The substrate 101 may have a double-well structure which includes, for example, an N type impurity layer on a surface of the semiconductor substrate, and a P type impurity layer inside this N type impurity layer. The substrate 101 (the P type impurity layer) serves as a channel body for a transistor that electrically connects the memory shafts 105 to a conducting layer 108, by using a conducting layer 102 of the lowermost layer in the laminated body LB as a control gate electrode.

The laminated body LB includes the plurality of conducting layers 102, which is laminated above the substrate 101, and interlayer insulating layers not shown in FIG. 3. These conducting layers 102 each serve as the word lines WL and control gate electrodes of the memory cells MC, or the selection gate lines (SGSb, SGS, SGD) and control gate electrodes of the selection gate transistors (STSb, STS, STD). The conducting layer 102 is constituted of a conducting layer of, for example, tungsten (W). The conducting layers 102 include respective contact portions 102a, which project to the X direction with respect to the conducting layer 102 positioned on its upper layer, and are connected to the row control circuit 3 (FIG. 1 and FIG. 2) via contact wirings 109 and wirings 110 connected to a surface of this contact portion 102a. The via contact wiring 109 and the wiring 110 are constituted of a conducting layer of tungsten (W) or similar material.

The memory shaft 105 extends to the Z direction and constitutes a channel body for the memory string MS and similar part. That is, an intersecting portion of the conducting layer 102 and the memory shaft 105 serves as a memory cell MC or a selection gate transistor (STSb, STS, STD). The memory shaft 105 includes a semiconductor layer 122 extending to the Z direction. The semiconductor layer 122 is opposed to the plurality of the conducting layers 102, and serves as a channel body for the memory cell MC and the selection gate transistor (STSb, STS, STD). A lower end of the semiconductor layer 122 is connected to a source line driver (not shown) via the substrate 101, the conducting layer 108 that serves as the source contact LI, and a conducting layer 107 that is disposed above the conducting layer 108 and serves as the source line SL. An upper end of the semiconductor layer 122 is connected to the column control circuit 2 (FIG. 1 and FIG. 2) via a conducting layer 106 that serves as the bit line BL. The conducting layer 106, the conducting layer 107, and the conducting layer 108 may be constituted with a conducting layer of tungsten (W) or similar material as a material. A plurality of the conducting layers 106 and the conducting layers 107 are disposed in the X direction and extend to the Y direction. The conducting layer 108 has an approximately plate-shape extending to the X direction and the Z direction along a side surface of the laminated body LB, and is connected to the substrate 101 at the lower end. As described later, the insulation separating layer is arranged between the conducting layer 108 and the laminated body LB to insulate and separate them.

The memory finger MF includes a support pillar (support structure) 111. The support pillar 111 also has a column-shape extending along the Z direction, similarly to the memory shaft 105. The support pillar 111 is for maintaining the laminated structure such as insulating layers (not shown) disposed between the conducting layers 102 during the manufacturing process. The support pillar 111 may have a similar structure to the memory shaft 105, or may be formed with insulating layers of silicon oxide ($SiO_2$), for example.

Figure 4:
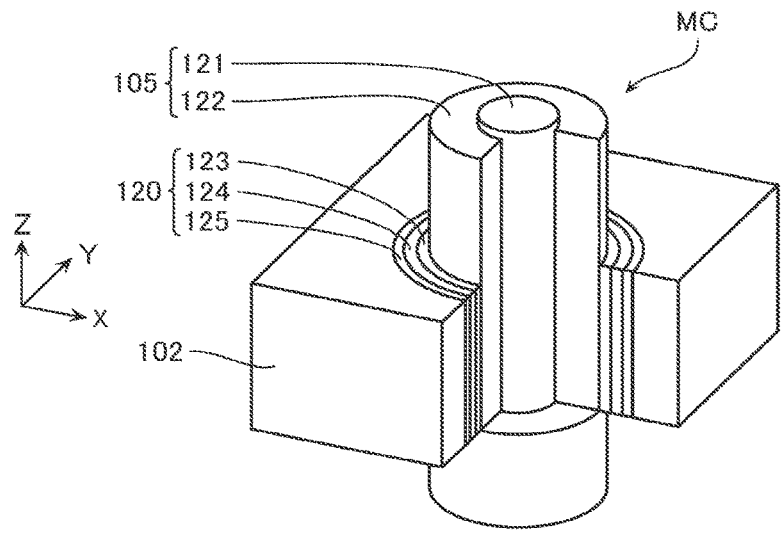
FIG. 4 is a perspective view illustrating apart of the configuration of the non-volatile semiconductor memory device according to the first embodiment.

FIG. 4 is a schematic perspective view illustrating a configuration of the memory cell MC. Although FIG. 4 illustrates the configuration of the memory cell MC, the selection gate transistor (STSb, STS, STD) may also be configured to be similar to the memory cell MC.

The memory cell MC is disposed at an intersecting portion of the conducting layer 102 and the memory shaft 105. The memory shaft 105 includes a core insulating layer 121, which is in a column-shape extending to the Z direction, and the semiconductor layer 122, which covers a side surface of the core insulating layer 121. A peripheral area of this semiconductor layer 122 is arranged with a memory gate insulating layer 120. The memory gate insulating layer 120 includes a tunnel insulating layer 123, which covers a side surface of the semiconductor layer 122, an electric charge accumulating layer 124, which covers a side surface of the tunnel insulating layer 123, and a block insulating layer 125, which covers a side surface of the electric charge accumulating layer 124.

The core insulating layer 121 is constituted of an insulating layer of, for example, silicon oxide ($SiO_2$). The semiconductor layer 122 is made of a semiconductor layer of, for example, polysilicon and serves as a channel body for the memory cell MC and the selection gate transistor (STSb, STS, STD). The tunnel insulating layer 123 is constituted of an insulating layer of, for example, silicon oxide ($SiO_2$). The electric charge accumulating layer 124 is constituted of an insulating layer of, for example, silicon nitride ($Si_3N_4$) that can accumulate electric charges. The block insulating layer 125 is constituted of an insulating layer of, for example, silicon oxide ($SiO_2$). In addition to the block insulating layer 125, it is possible to add a second block insulating layer constituted of an insulating layer of high permittivity (high-dielectric insulating layer). For example, the second block insulating layer can be constituted of alumina ($Al_2O_3$), hafnium oxide ($HfO_x$) or similar material.

The semiconductor layer 122, the tunnel insulating layer 123, the electric charge accumulating layer 124 and the block insulating layer 125 have cylindrical shapes extending to the Z direction along the side surface of the core insulating layer 121.

Figure 5:
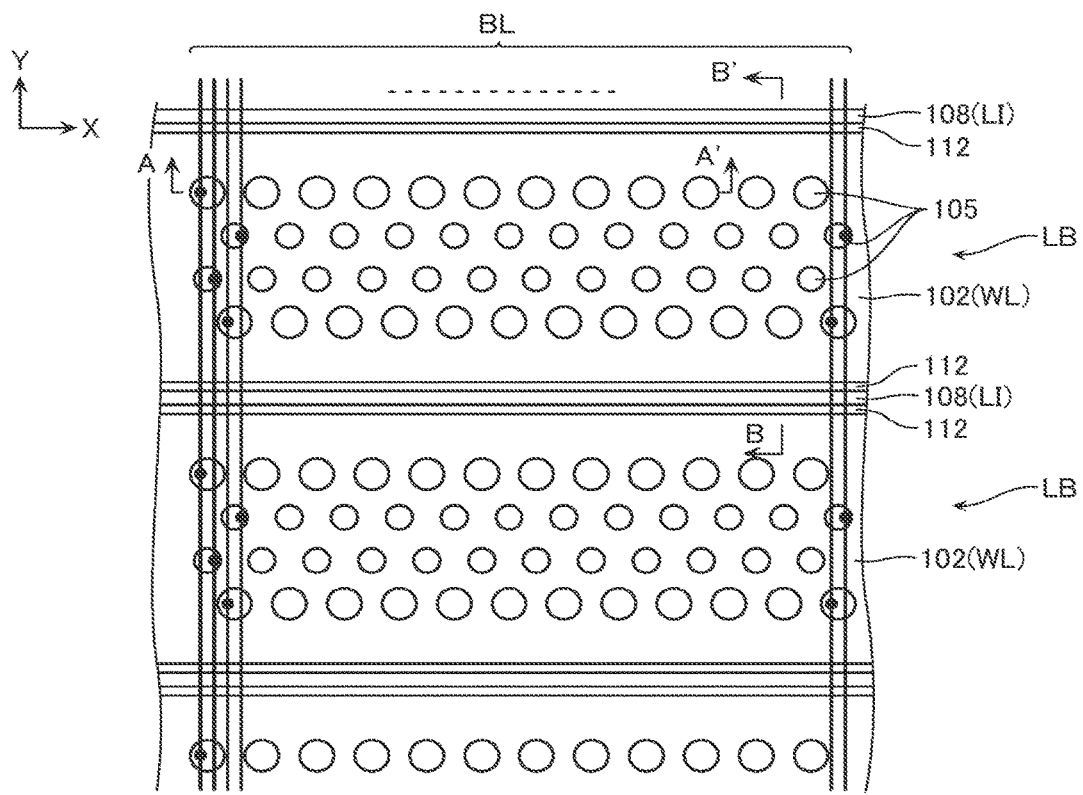
FIG. 5 is a plan view illustrating a part of the configuration of the non-volatile semiconductor memory device according to the first embodiment.
Figure 6:
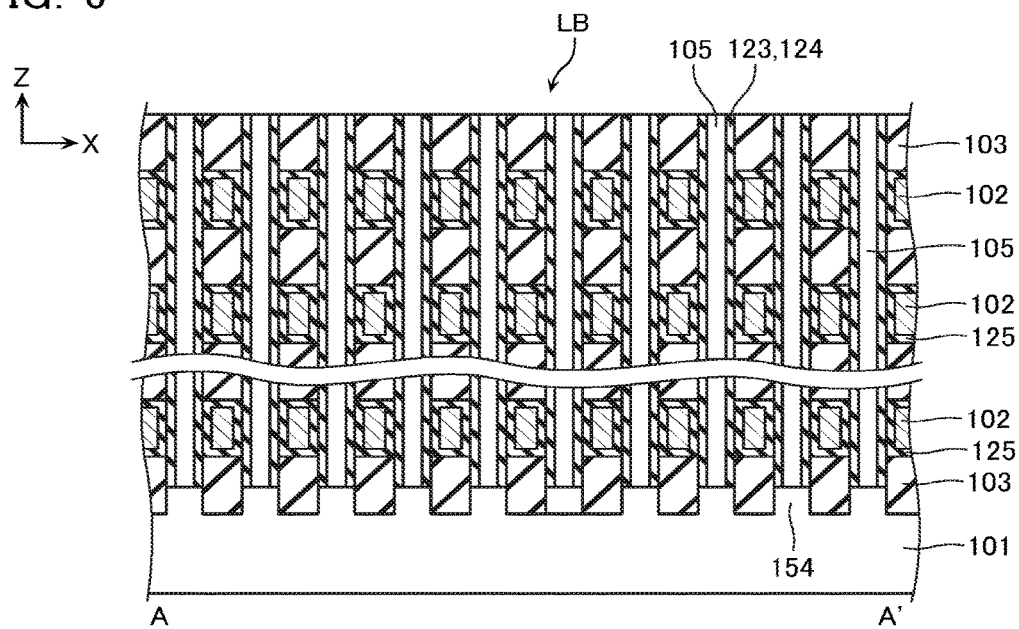
FIG. 6 is a cross-sectional view illustrating a part of the configuration of the non-volatile semiconductor memory device according to the first embodiment.
Figure 7:
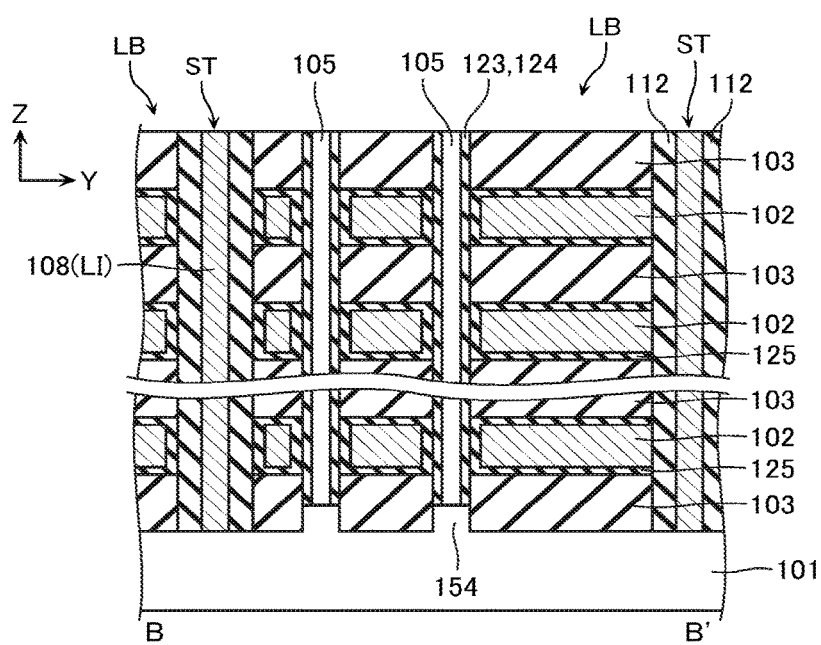
FIG. 7 is a cross-sectional view illustrating a part of the configuration of the non-volatile semiconductor memory device according to the first embodiment.

FIG. 5 is a plan view illustrating a part of the configuration of the non-volatile semiconductor memory device according to the first embodiment. FIG. 6 and FIG. 7 are cross-sectional views illustrating a part of the configuration of an identical non-volatile semiconductor memory device, and illustrate cross-sectional areas corresponding to A-A' line and B-B' line in FIG. 5, respectively. FIG. 5 to FIG. 7 are for illustrative purpose and the specific configuration is changeable as necessary. The memory gate insulating layer 120 is omitted in FIG. 5.

As shown in FIG. 5, the laminated body LB extends to the X direction and the plurality of laminated bodies LB are disposed in the Y direction. The conducting layers 108 (source contacts LI) are disposed via insulation separating layers 112 (first insulation separating layers) between the laminated bodies adjacent in the Y direction. The insulation separating layer 112 is made of an insulating layer of, for example, silicon oxide ($SiO_2$). The insulation separating layer 112 extends to the X direction, similarly to the laminated body LB, and acts to insulate and separate two laminated bodies LB that are opposed. The memory shafts 105 are arranged in a staggered pattern with a predetermined density. An example shown in FIG. 5 has the memory shafts 105 disposed in the staggered pattern along four rows L1 to L4 in the Y direction in one laminated body LB. However, the arrangement of the memory shafts 105 is changeable to, for example, a triangular disposition and a square disposition, as necessary. It is needless to say that the number of the rows of the memory shafts 105 included in one laminated body LB is not limited to four.

As shown in FIG. 6 and FIG. 7, the laminated body LB includes interlayer insulating layers 103 disposed between the plurality of the conducting layers 102. The interlayer insulating layer 103 is constituted of an insulating layer of, for example, silicon oxide ($SiO_2$). Lower ends of the memory shafts 105 are connected to a semiconductor layer 154, which extends from the substrate 101. The block insulating layer 125 is formed to cover a peripheral area of the conducting layer 102 in examples shown in these FIG. 6 and FIG. 7.

Manufacturing Method

Next, with reference to FIG. 8 to FIG. 17, a method for manufacturing a non-volatile semiconductor memory device according to the embodiment is described.

Figure 8:
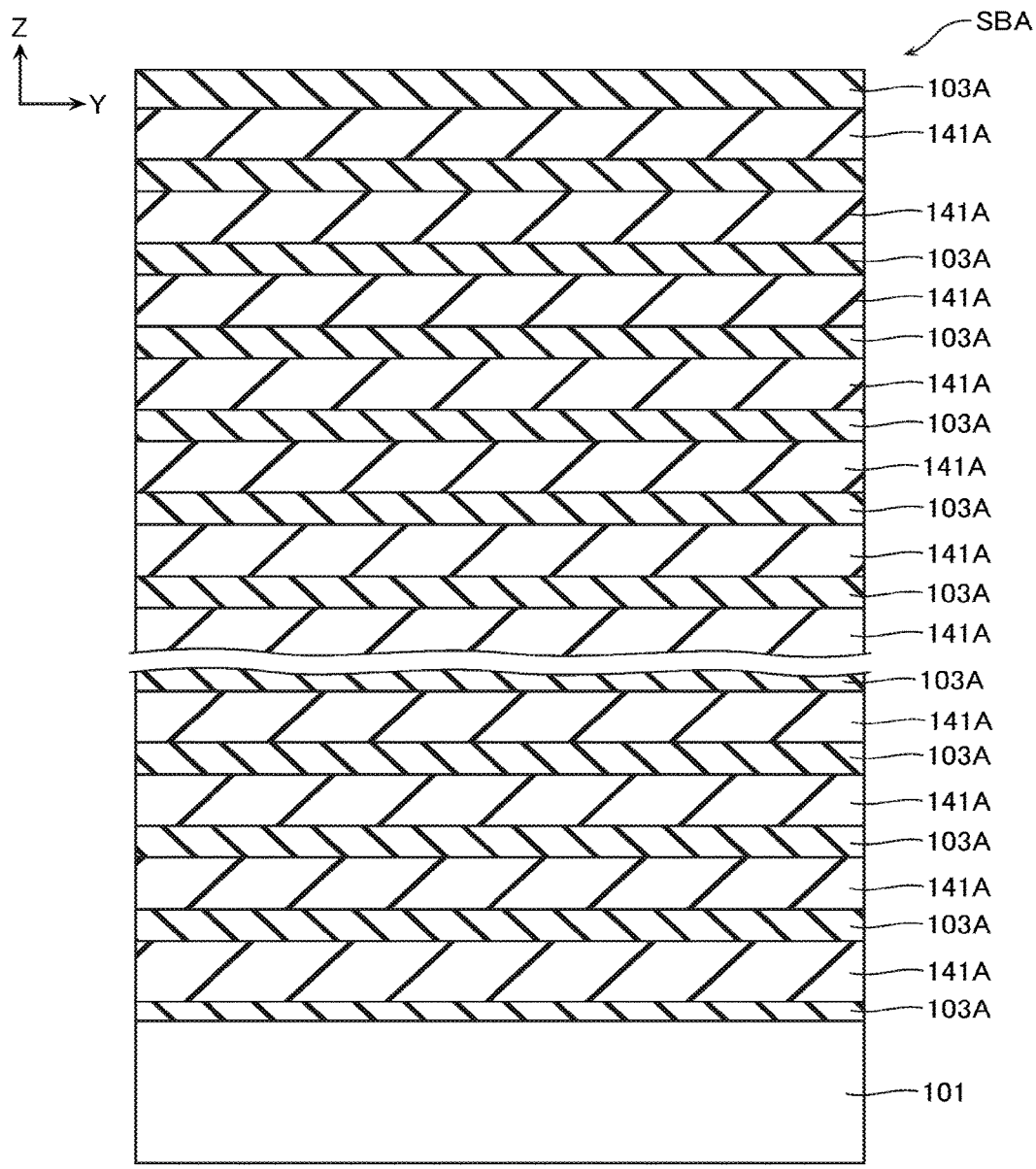
FIG. 8 to FIG. 17 describe a method for manufacturing the non-volatile semiconductor memory device according to the first embodiment.

As shown in FIG. 8, a laminated body SBA is formed by depositing interlayer insulating layers 103A and sacrificial layers 141A in alternation on the substrate 101. The sacrificial layer 141A is removed by etching in a later-described step. The sacrifice layer 141a is formed in order to embed a conducting layer in a cavity left after the etching removal of the sacrifice layer 141a. The interlayer insulating layer 103A is a layer to become the interlayer insulating layer 103. The interlayer insulating layer 103A is formed of, for example, silicon oxide ($SiO_2$). The sacrificial layer 141A is formed of, for example, silicon nitride (SiN).

Figure 9:
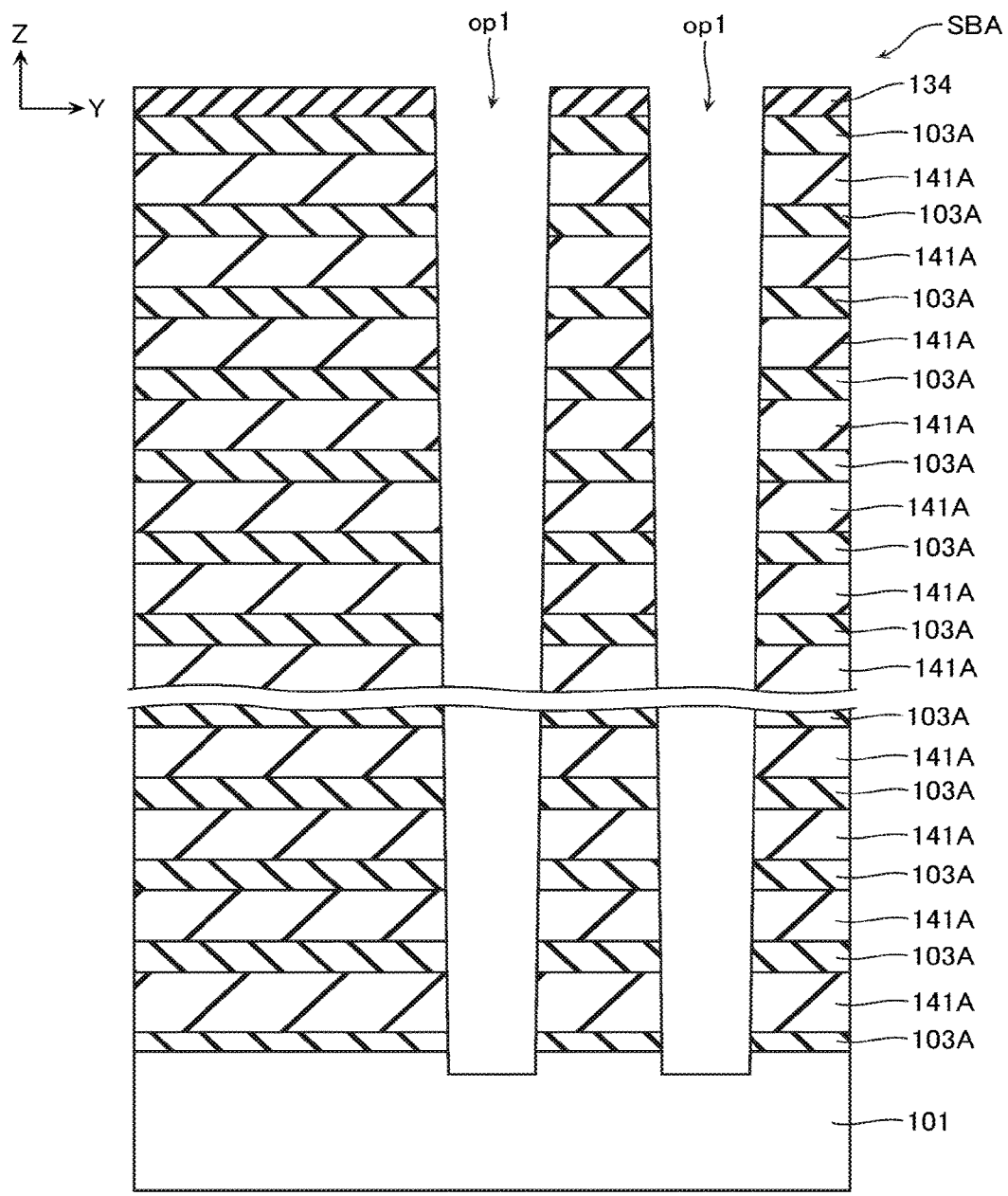
Figure 10:
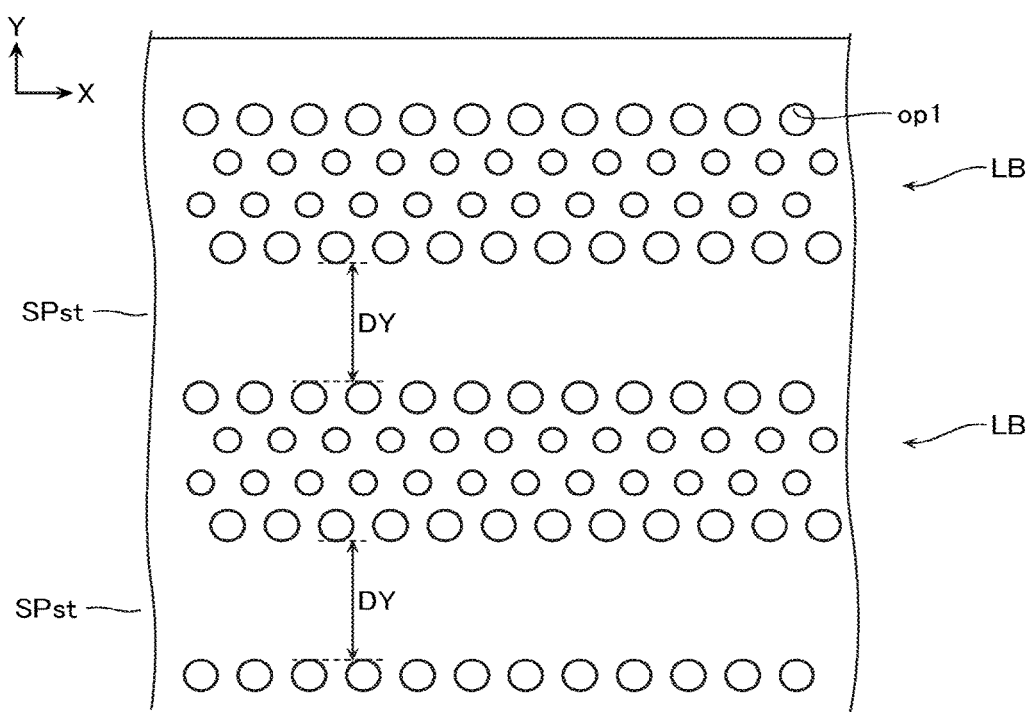

Next, as shown in FIG. 9 and FIG. 10, openings op1 are formed in the laminated body SBA. FIG. 9 is a cross view along an identical YZ plane similar to FIG. 8, and FIG. 10 is an XY plan view of a top surface of the laminated body SBA.

The aforementioned memory shafts 105 are formed in these openings op1. After forming an insulating layer 134 on the top surface of the laminated body SBA, the openings op1 are formed in the laminated body SBA by performing isotropic etching such as RIE (Reactive Ion Etching) using this insulating layer 134 as a mask. The openings op1 are formed to reach the substrate 101 penetrating the interlayer insulating layers 103C, 103A, and the sacrificial layers 141A, 141B.

The openings op1, as described above, are arranged, for example, in the staggered pattern with the predetermined density on a surface of the laminated body SBA. However, the openings op1 are not formed in regions SPst (width DY in the Y direction), which are for the conducting layers 108 which separate the above-described laminated body SBA and serve as the source contacts LI, and the insulation separating layers 112 formed on both side surfaces of these conducting layers 108. Thus, the openings op1 are not formed equally spaced in the Y direction but randomly arranged. In view of this, there may be a case where opening widths of the openings op1 in XY plane that are adjacent to the region SPst may be different from opening widths of the openings op1 that are not adjacent to the region SPst, which means the openings op1 are sandwiched between other openings op1 in the Y direction. This will be described later.

Figure 11:
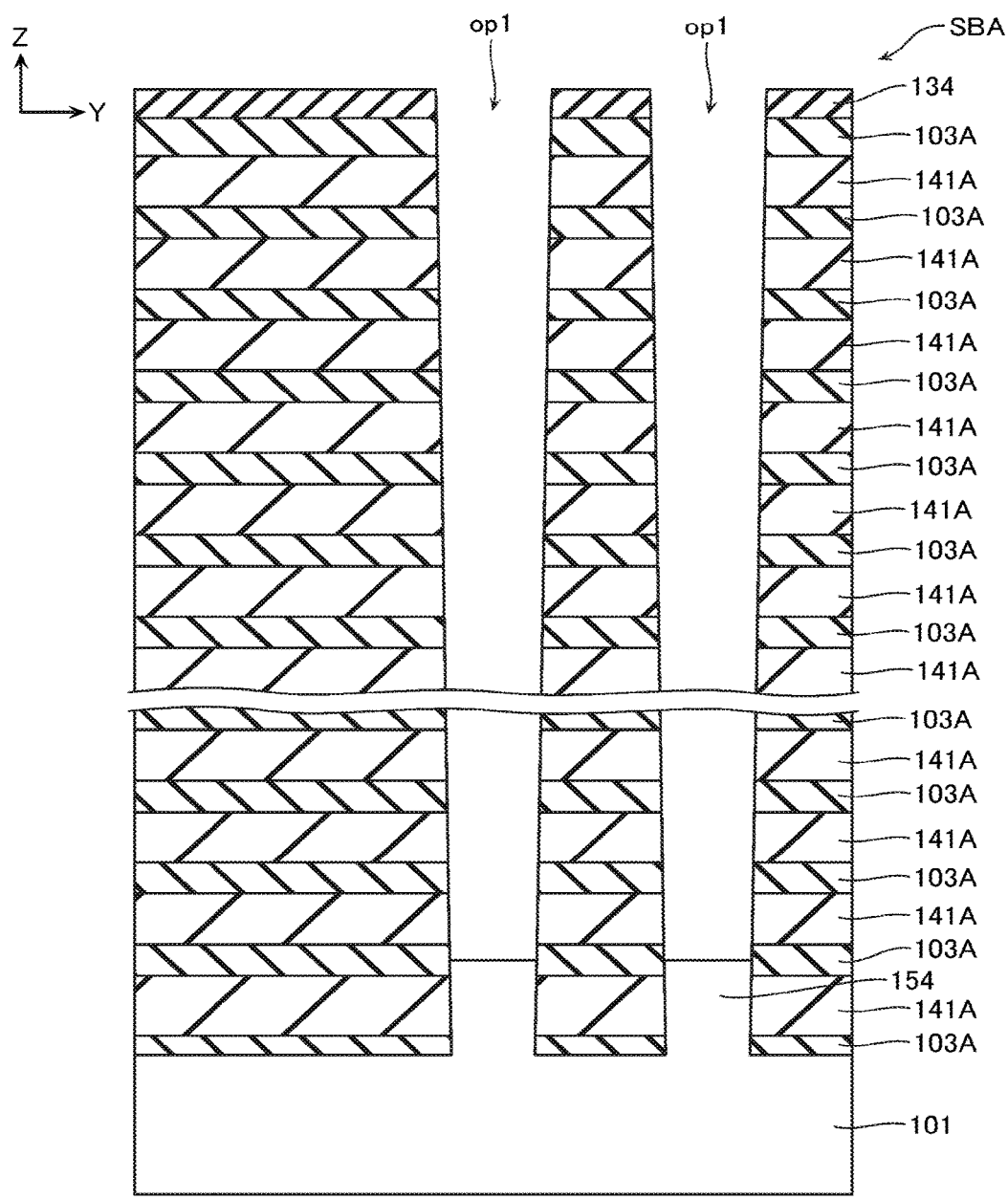

Next, as shown in FIG. 11, a crystal growth method such as an epitaxial growth is performed to form the semiconductor layer 154 at bottom portions of the openings op1. The semiconductor layer 154 is formed of, for example, single-crystal silicon integrally formed with the substrate 101. As shown in FIG. 11, here, the crystal growth method is performed until a surface of the semiconductor layer 154 reaches the interlayer insulating layer 103A, which is the lowermost layer, for example.

Figure 12:
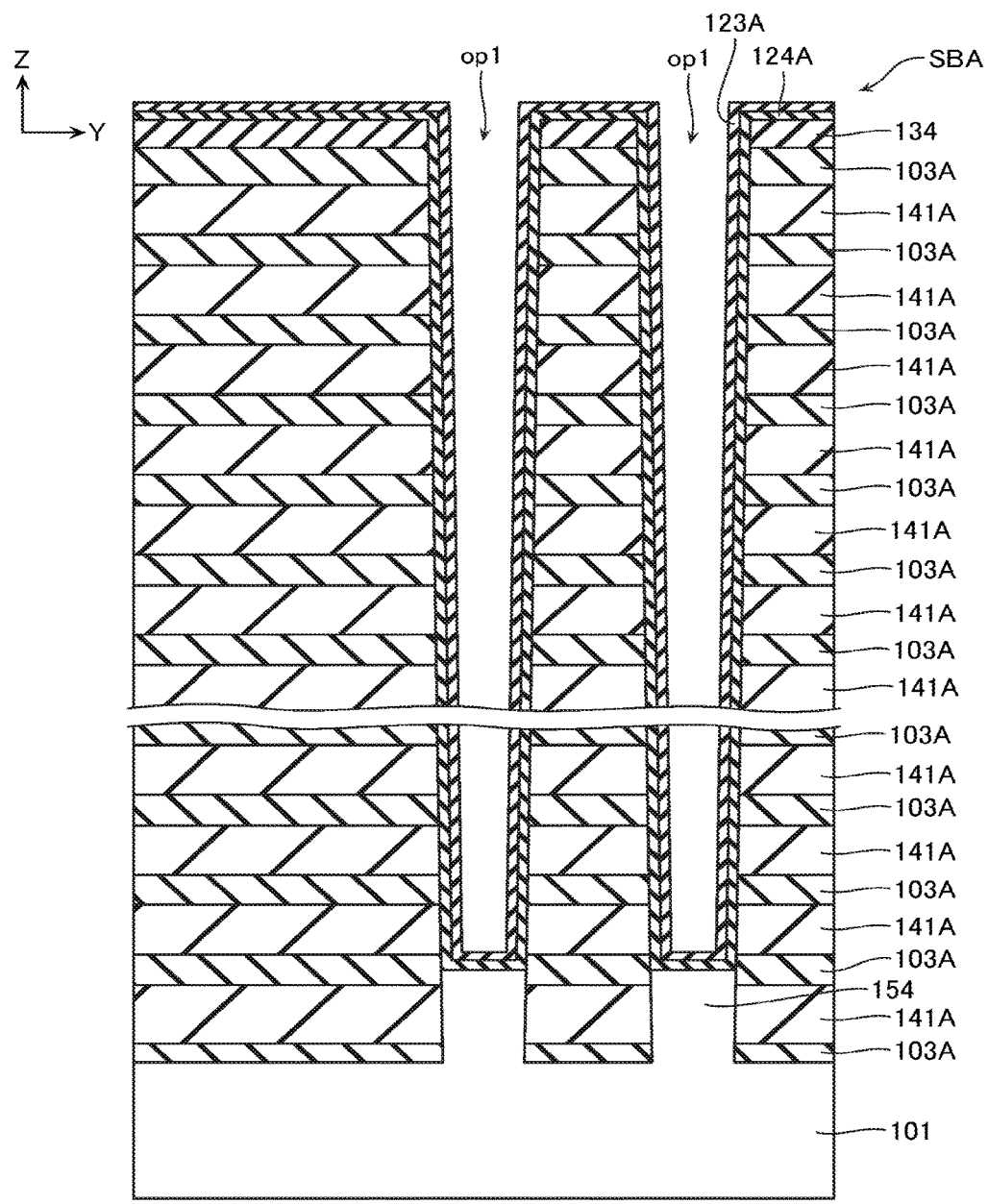

Next, as shown in FIG. 12, an electric charge accumulating layer 124A, which becomes the electric charge accumulating layer 124, and an insulating layer 123A, which becomes the tunnel insulating layer 123 are formed on inner walls, and the bottom portions of the opening op1, and on the top surface of the laminated body SBA. The electric charge accumulating layer 124A is formed of, for example, silicon nitride (SiN). The insulating layer 123A is formed of, for example, silicon oxide ($SiO_2$).

Figure 13:
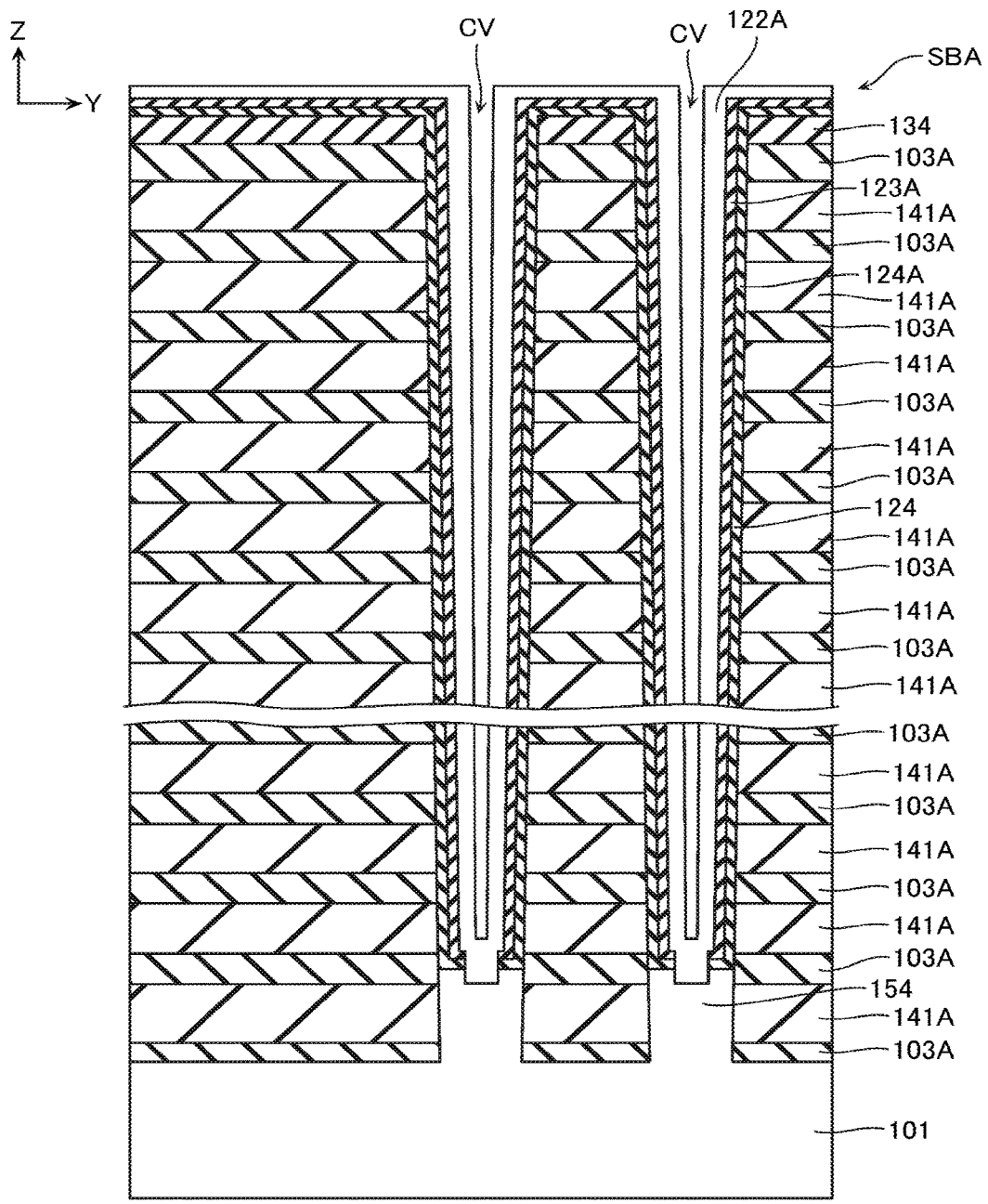
Figure 14:
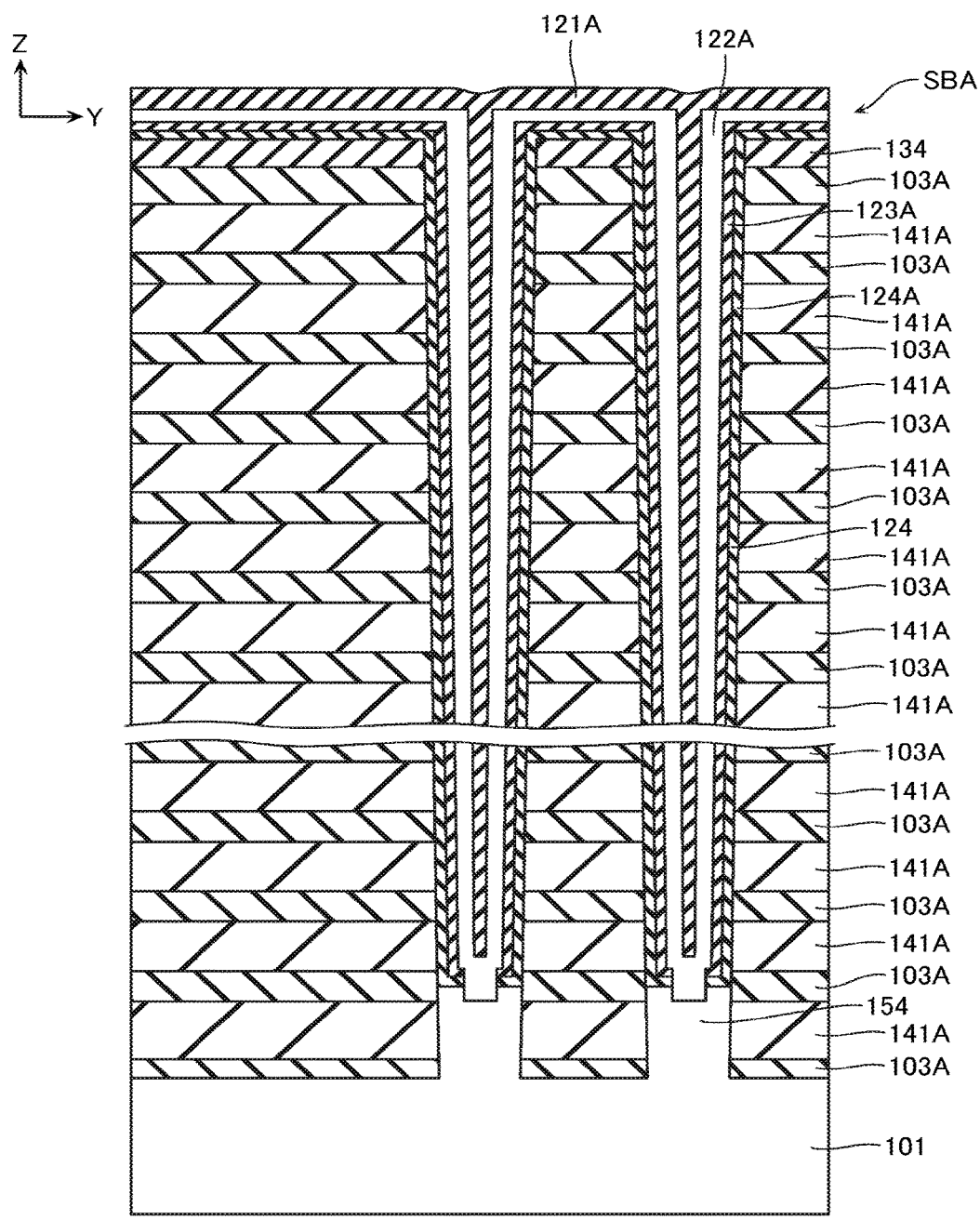

Next, as shown in FIG. 13, after removing the electric charge accumulating layer 124A and the insulating layer 123A deposited at the bottom portions of the openings op1 by RIE, a semiconductor layer 122A is formed on the inner walls and the bottom portions of the openings op1, and on the top surface of the laminated body SBA. The semiconductor layer 122A is the material of the aforementioned semiconductor layer 122, which is formed of amorphous silicon, for example. The semiconductor layer 122A is deposited while keeping cavities CV internally. Further, as shown in FIG. 14, a core insulating layer 121A is embedded within the opening op1 such that the cavities are filled. Then, perform planarization by performing CMP (Chemical Mechanical Polishing) or similar operation using the insulating layer 134 or similar part as a stopper. Further, perform a heat treatment to make a crystalline structure of the semiconductor layer 122, which is in an amorphous state, to be a polycrystalline structure.

Figure 15:
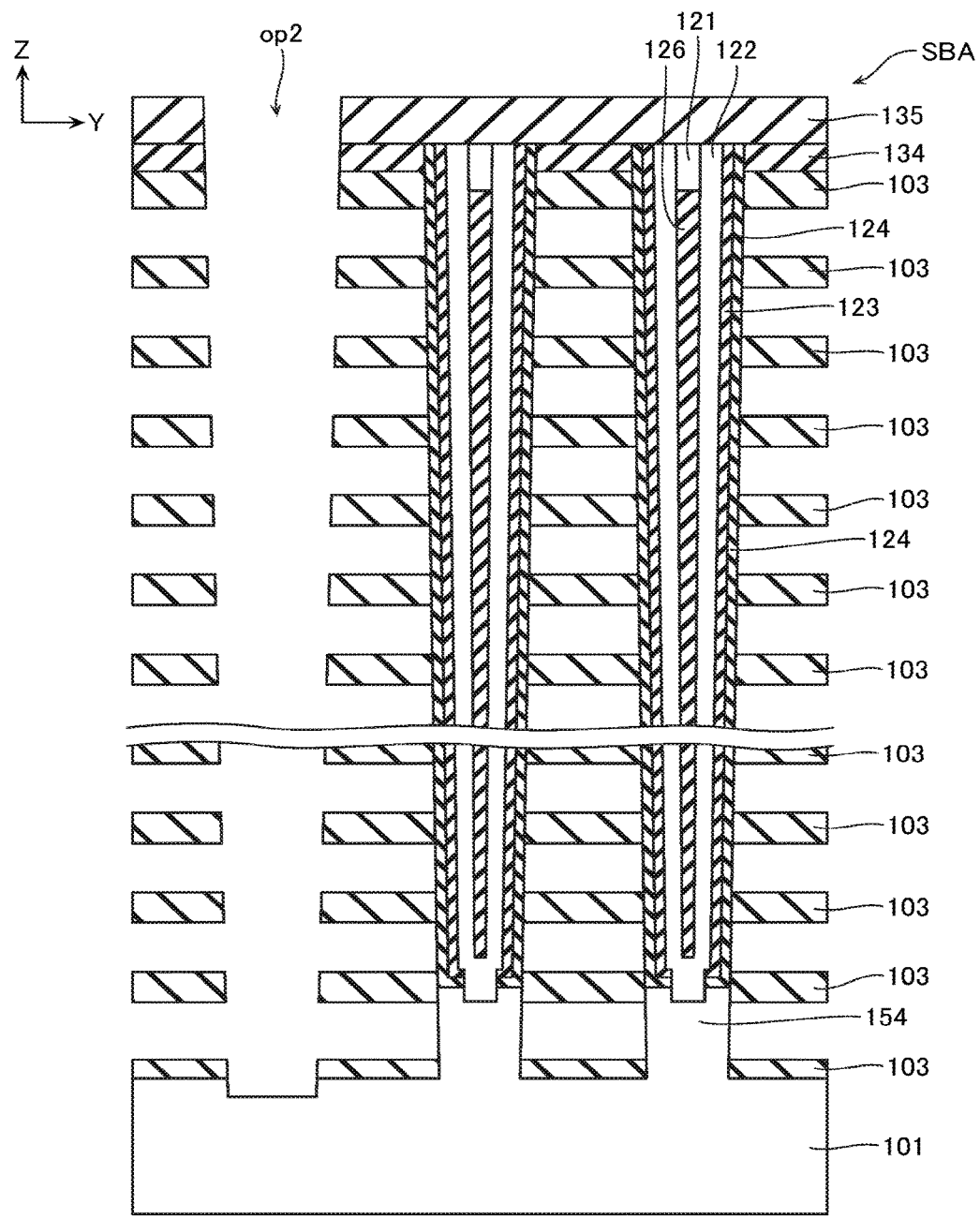

Further, as shown in FIG. 15, form an insulating layer 135 on the top surface of the laminated body SBA, and then perform isotropic etching such as RIE using this insulating layer 135 as a mask to form a groove op2 penetrating the laminated body SBA. In this groove op2, the above-described conducting layer 108 and the insulation separating layer 112 are formed. Afterwards, perform wet etching using Phosphoric Acid, for example, to remove the sacrificial layers 141A and 141B, and obtain the state in FIG. 15.

Figure 16:
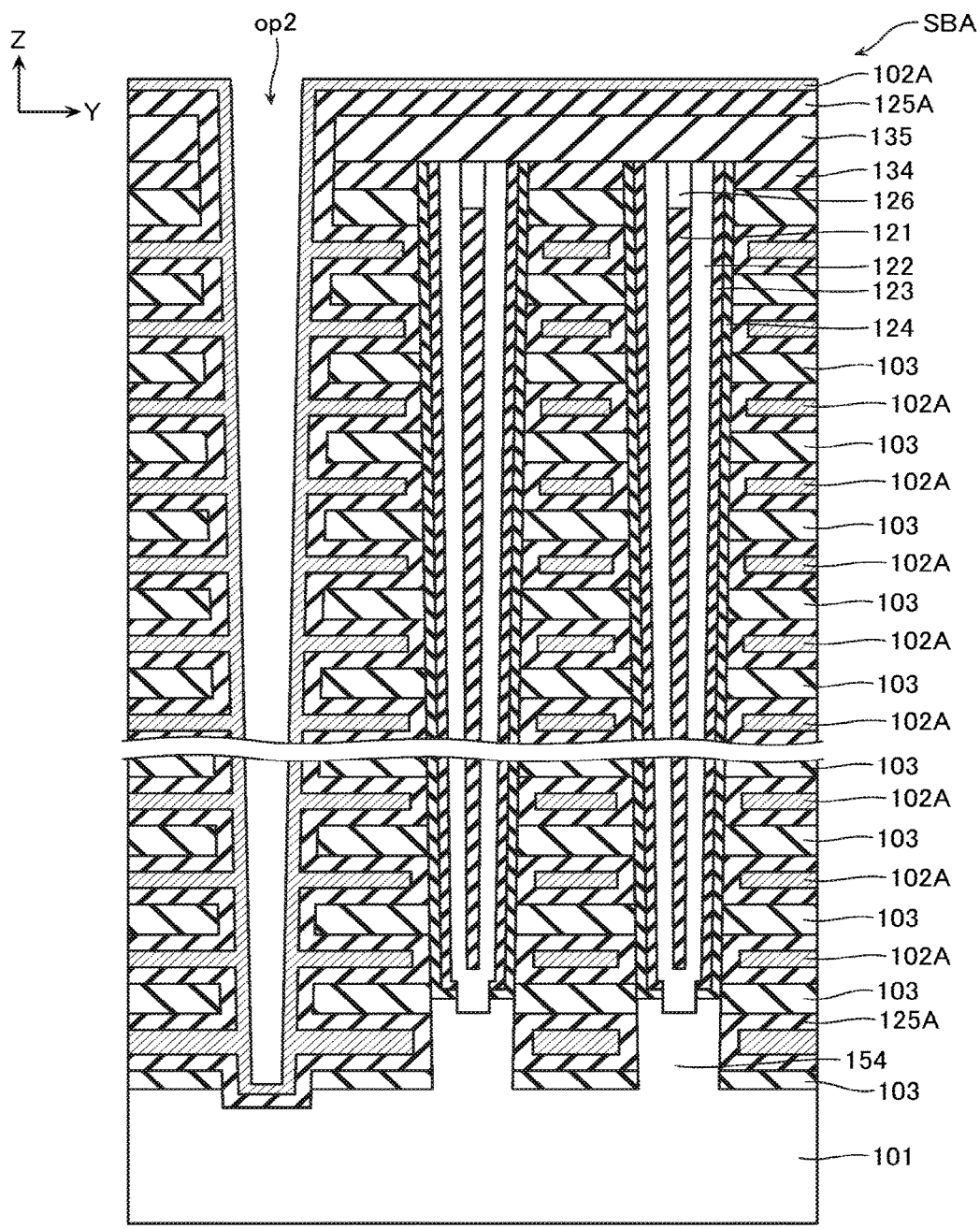

As shown in FIG. 16, deposit an insulating layer 125A and the conducting layer 102A along inner walls of the groove op2 and inner walls of the cavities where the sacrificial layers 141A, 141B are removed using a method such as CVD method. The insulating layer 125A is an insulating film, which becomes the aforementioned block insulating layer 125, and a conducting layer 102A is a layer, which becomes the aforementioned conducting layer 102.

Figure 17:
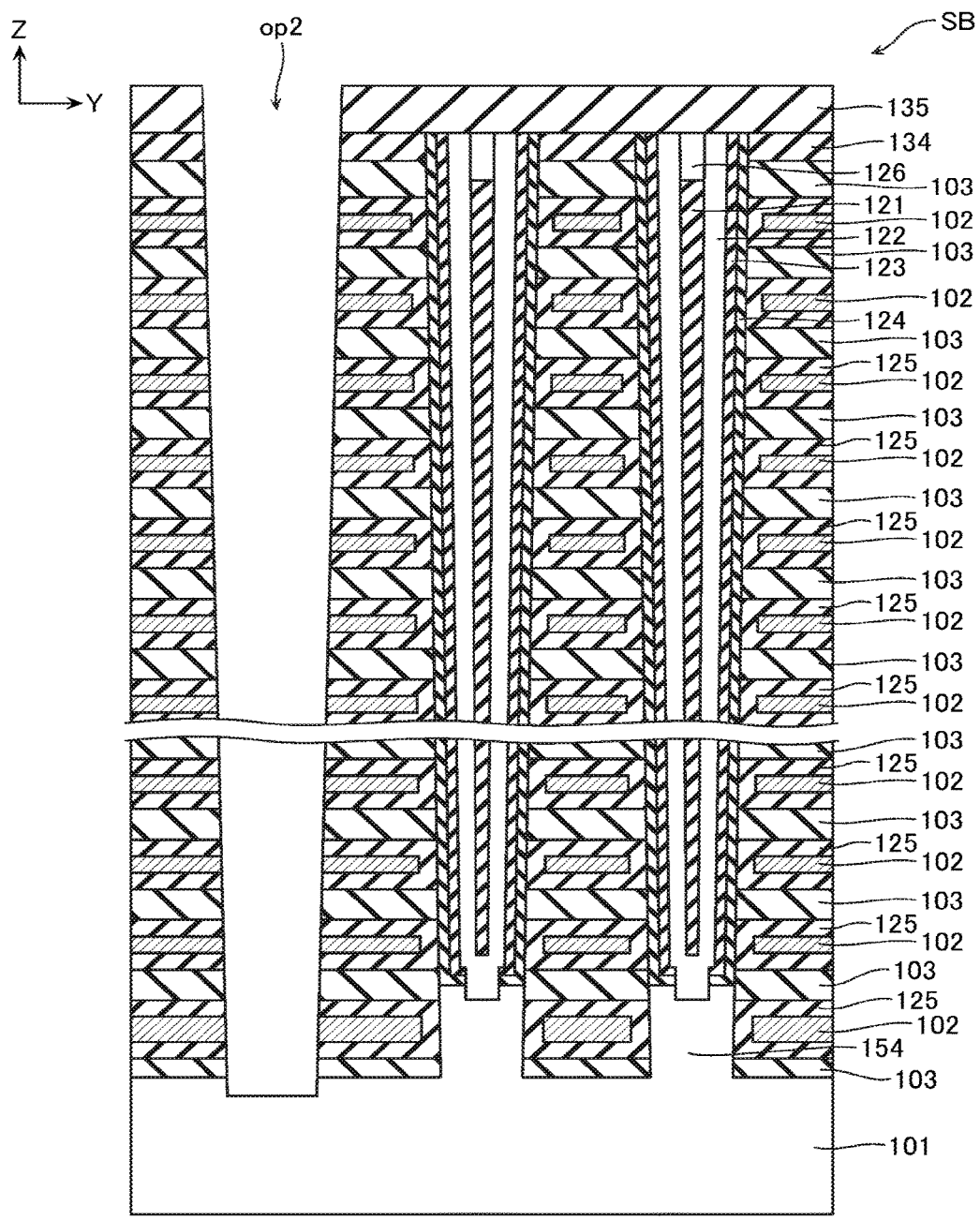

Next, as shown in FIG. 17, remove the insulating layer 125A and the conducting layer 102A, which are formed on the top surface of the insulating layer 135 and on sidewalls of the groove op2 by a method such as wet etching. This makes the conducting layer 102A to become a plurality of separated films that do not short-circuit to one another in the laminating direction, and to be formed as the conducting layer 102 constituting the laminated bodies LB described in FIG. 3. Then, the insulation separating layer 112 and the conducting layer 108 (the source contact LI) are embedded in the groove op2, thereby complete the structure shown in FIG. 5 to FIG. 7.

Figure 18:
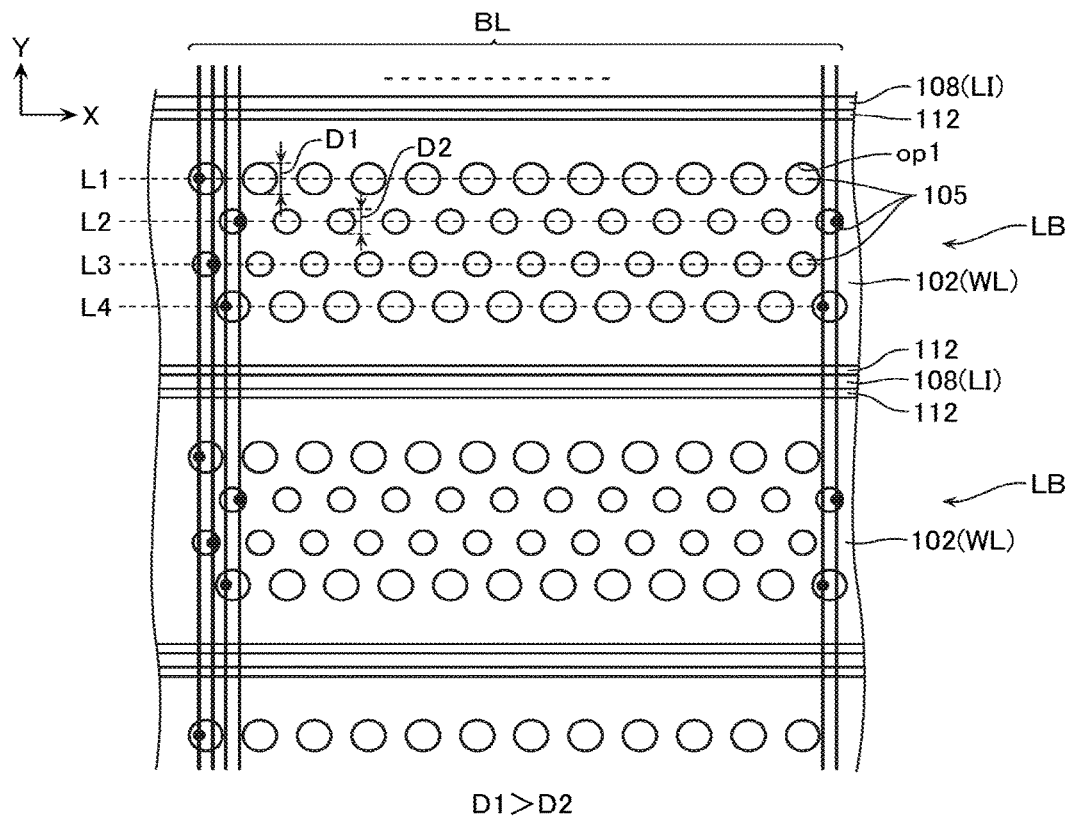
FIG. 18 is a plan view illustrating a part of the configuration of the non-volatile semiconductor memory device according to the first embodiment.

As described above, as for the semiconductor memory device according to the embodiment, the openings op1 in which the memory shafts 105 are embedded are formed with an irregular pitch in the Y direction for an area of the region SPst to form such as the insulation separating layer 112. In case where a photo etching process is performed to such an opening pattern, as shown in FIG. 18, a diameter D1 of the memory shafts 105 in the rows L1 or L4, which are on sides close to the insulation separating layers 112, tends to be larger than a diameter D2 of the memory shafts 105 in the rows L2, L3, which are located on sides farther than the rows L1, L4 when seen from the insulation separating layer 112.

Figure 19:
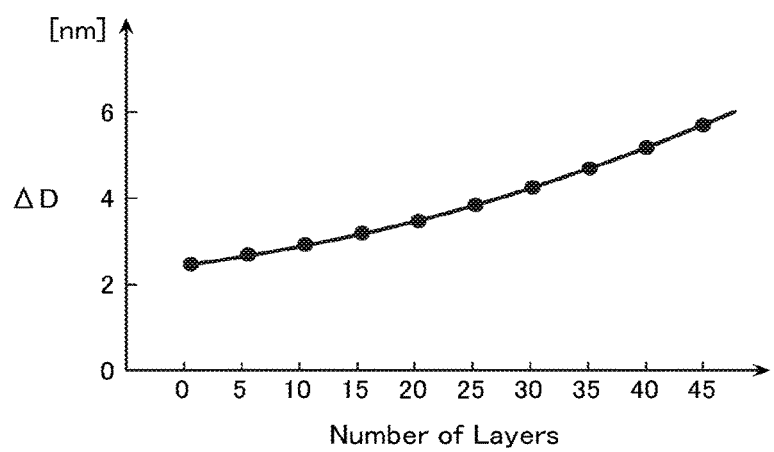
FIG. 19 is a graph describing a structure of the non-volatile semiconductor memory device according to the first embodiment.

The memory shaft 105 has, what is called, a forward taper shape, that a diameter Du at an upper end portion is generally large, and a diameter Dl at a lower end portion is small (Dl<Du) because the diameter becomes small as heading down to the lower end. In this case, the difference between the diameter of the memory shaft 105 positioned in the rows L1 or L4 and the diameter of the memory shaft 105 positioned in the rows L2 or L3 becomes larger as heading up to the upper layer. FIG. 19 illustrates a relation between the positions of the conducting layers 102 in the Z direction (the number of layers counted from the lower side) and the difference ΔD between the diameter of the memory shaft 105 positioned in the rows L1 or L2 and the diameter of the memory shaft 105 positioned in the rows L2 or L3, corresponding to the respective positions in the Z direction. The higher the position of the conducting layer 102 in the Z direction is, the larger the diameter difference ΔD of the memory shafts 105 between the row L1 and the row L2 becomes.

As described above, with the semiconductor memory device according to the first embodiment described with reference to FIG. 1 to FIG. 7, a non-uniformity of the arrangement causes variations in the diameter in the memory shafts 105. In such a structure, the characteristics of the memory cell MC also vary.

Figure 20:
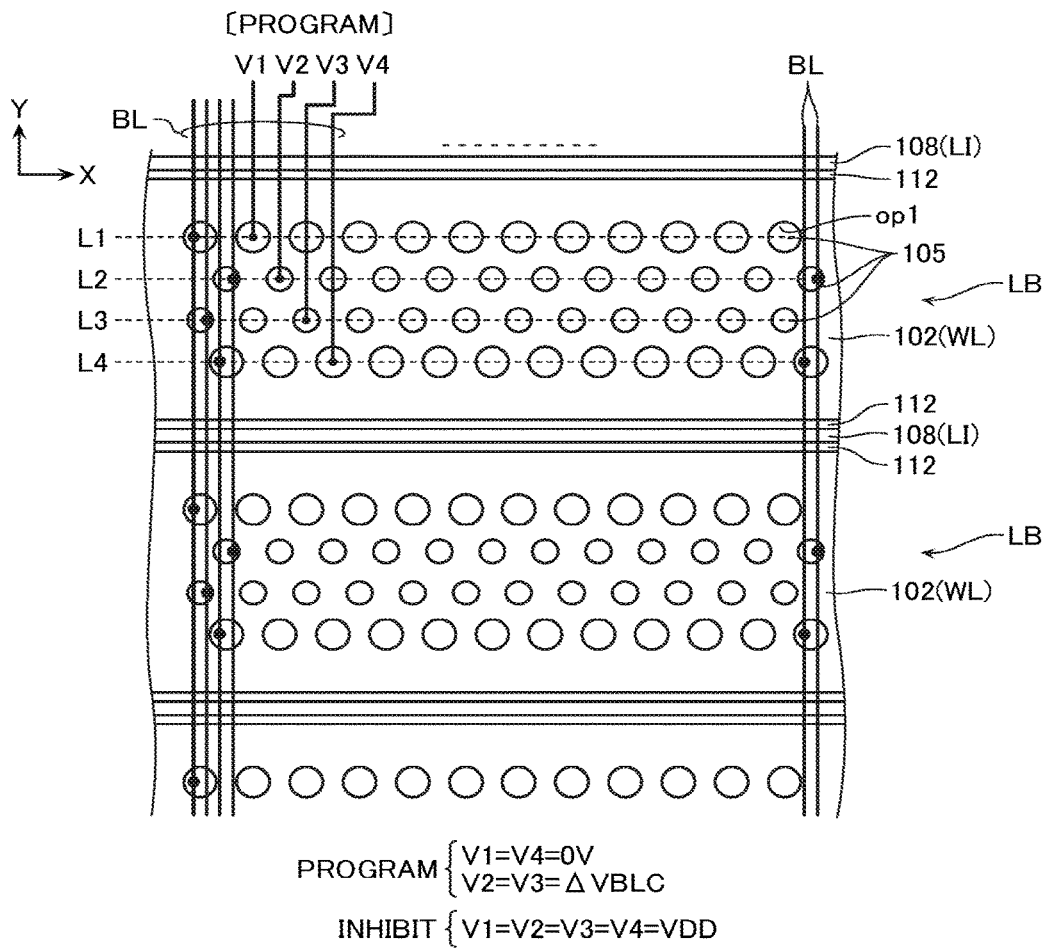
FIG. 20 is a schematic diagram describing an operation of the non-volatile semiconductor memory device according to the first embodiment.

Therefore, with the semiconductor memory device according to the first embodiment, a voltage is applied during a writing operation as shown in FIG. 20. FIG. 20 is a conceptual diagram describing a voltage applied to the bit line BL. Although illustration is omitted, similar to a well-known writing operation, a selected word line WL is applied with a program voltage VPGM (for example, 20 V or more) and a non-selected word line WL is applied with a path voltage VPASS (approximately 10 V) with which writing does not occur. A drain side selection gate line SGD of the memory shaft 105 to be selected is applied with a power supply voltage VDD.

When performing inhibition of writing (INHIBIT) in a certain memory shaft 105, the bit line BL connected to this memory shaft 105 is applied with the power supply voltage VDD. If the drain side selection gate line SGD is applied with the power supply voltage VDD similarly, the drain side selection gate transistor STD turns to a non-conductive state, and the memory shaft 105 is in a floating state. This makes the selected memory cell, which is connected to this memory shaft 105, to be in a writing inhibited state, and its threshold voltage does not vary.

On the other hand, when variation in the threshold voltage of the memory cell MC is desired (writing permit), the bit line BL is provided with smaller voltage than the power supply voltage VDD, however, the voltage value is a value varied depending on a row within the laminated body LB.

First, voltages V1, V4, which are applied to the bit line BL connected to the memory shaft 105 in the rows L1 or L4 on a side of the conducting layer 108 and the insulation separating layer 112 within the laminated body LB, are set to 0 V.

On the other hand, voltages V2, V3, which are applied to the bit line BL connected to the memory shaft 105 in the rows L2 or L3 on a side far from the conducting layer 108 and the insulation separating layer 112, are set to ΔVBLC, which is slightly larger than 0 V. A value of ΔVBLC, for example, is a value of approximately 0.2 V. That is, the voltage approximately ΔVBLC is provided to the semiconductor layer 122 of the memory shaft 105 in the row L2 and the row L3 via the bit line BL to enhance a channel potential, and perform the writing operation. On the other hand, the semiconductor layer 122 of the memory shaft 105 in the row L1 and the row L4 is provided with 0 V to make a channel potential low compared with the rows L2 and L3. Note that during the writing operation, every drain side selection gate transistor STD is in conductive state.

Here, if the voltage applied to the control gate electrode of the selected memory cell is constant, a potential difference between the selected word line WL of a cell to be written in and the channel body is different between the semiconductor layer 122 in the rows L2, L3 and the semiconductor layer 122 in the rows L1, L4. That is, the potential difference of the former is smaller than the potential difference of the latter.

Thus, according to the writing operation of the embodiment, the applied voltage to the bit line BL varies depending on the position of the rows (L1 to L4), difference in the writing speed caused by difference of the row is reduced, and thus uniformity in the writing speed can be achieved.

Second Embodiment

Next, a semiconductor memory device according to a second embodiment will be described with reference to FIG. 21. Although a configuration of the semiconductor memory device according to the second embodiment is approximately identical to the first embodiment, an operation during the writing operation is different from that of the first embodiment.

It differs from the first embodiment with a point that, in this second embodiment, what is called, a Quick Pass Write method is employed during the writing operation. Here, a brief description related to the Quick Pass Write method will be given with reference to FIG. 21.

Figure 21:
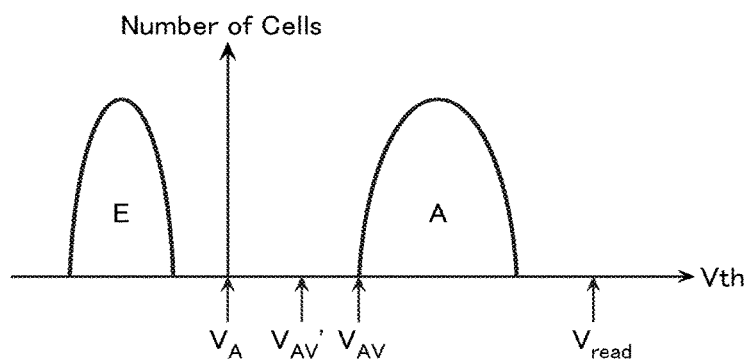
FIG. 21 is a graph describing an operation of a non-volatile semiconductor memory device according to a second embodiment.

As shown in FIG. 21, the Quick Pass Write method is a method first executing a first verify reading operation and a first writing operation using a verify reading voltage $V_{AV'}$ that is slightly lower than the ordinary verify reading voltage $V_{AV}$, then executing a second verify reading operation and a second writing operation using the verify reading voltage $V_{AV}$.

A width of a threshold voltage distribution of the memory cell MC can be narrower by a verify reading voltage executing two different verify reading operations.

When performing this Quick Pass Write method, values of voltages V1, V4, which are applied to the bit line BL connected to the memory shaft 105 in the rows L1 or L4 on the side of the conducting layer 108 and the insulation separating layer 112 within the laminated body LB, are set to BLC_QPW during the first writing operation. BLC_QPW is set to a value slightly larger than 0 V, for example, to approximately 0.4 V. On the other hand, voltages V2, V3, which are applied to the bit line BL connected to the memory shaft 105 in the rows L2 or L3 on the side far from the conducting layer 108 and the insulation separating layer 112, are set to BLC_QPW+ΔVBLC, which is slightly larger than this voltage of BLC_QPW. A value of ΔVBLC is, for example, approximately a value of 0.2 V.

Then, upon detecting the lower limit value of the threshold voltage distribution of the selected memory cell MC reaches $V_{AV'}$ during the first verify reading operation (the verify reading voltage $V_{AV'}$), the writing operation transitions to the second writing operation and the second verify reading operation (the verify reading voltage $V_{AV}$). A voltage applied during this second writing operation is identical to the first embodiment. That is, the voltages V1, V4, which are applied to the bit line BL connected to the memory shaft 105 in the rows L1 or L4 on the side of the conducting layer 108 and the insulation separating layer 112, are set to 0 V. The voltages V2, V3, which are applied to the bit line BL connected to the memory shaft 105 in the rows L2 or L3 on the side far from the conducting layer 108 and the insulation separating layer 112, are set to ΔVBLC, which is slightly larger than 0 V. A value of ΔVBLC is, for example, approximately a value of 0.2 V. Note that an operation for the memory shaft 105 that the writing is inhibited is similar to the first embodiment.

As described above, according to this second embodiment, the writing operation based on, what is called, the Quick Pass Write method is executed. The writing speed between the plurality of memory cells can be uniformed without being affected by variations in diameters of the memory shafts 105 even with this Quick Pass Write method.

Third Embodiment

Next, a semiconductor memory device according to the third embodiment will be described with reference to FIG. 22. Although a configuration of the semiconductor memory device according to this third embodiment is approximately identical to the first embodiment, an operation during the writing operation is different from that of the first embodiment.

In the first and the second embodiment, the writing operation that varies the voltages applied to the bit line BL in accordance with the position in the Y direction of the memory shaft 105 including the selected memory cell MC (distance in the Y direction from the conducting layer 108 and the insulation separating layer 112) is performed. In the third embodiment, in addition to the above, the voltages applied to the bit line BL are varied depending on positions of the selected memory cell or the selected word line WL in the Z direction. As described in FIG. 19, the diameter difference ΔD between the memory shaft 105 in the row L1 and the memory shaft 105 in the row L2 increases toward the upper part of the laminated body LB. The third embodiment is intended to reduce the effect caused by changes of this diameter difference ΔD.

Figure 22:
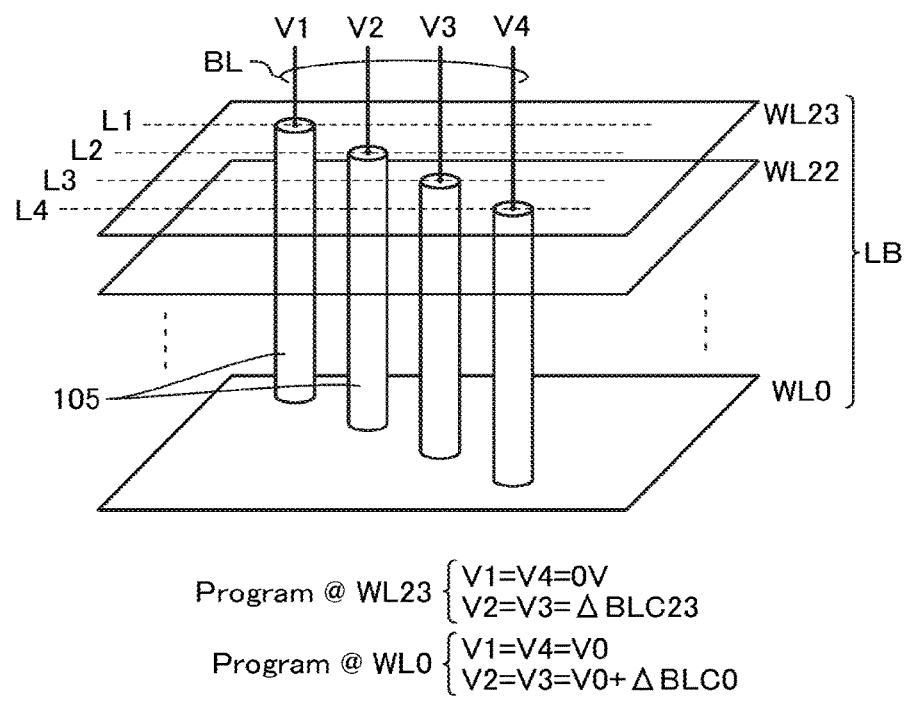
FIG. 22 is a schematic diagram describing an operation of a non-volatile semiconductor memory device according to a third embodiment.
Figure 23:
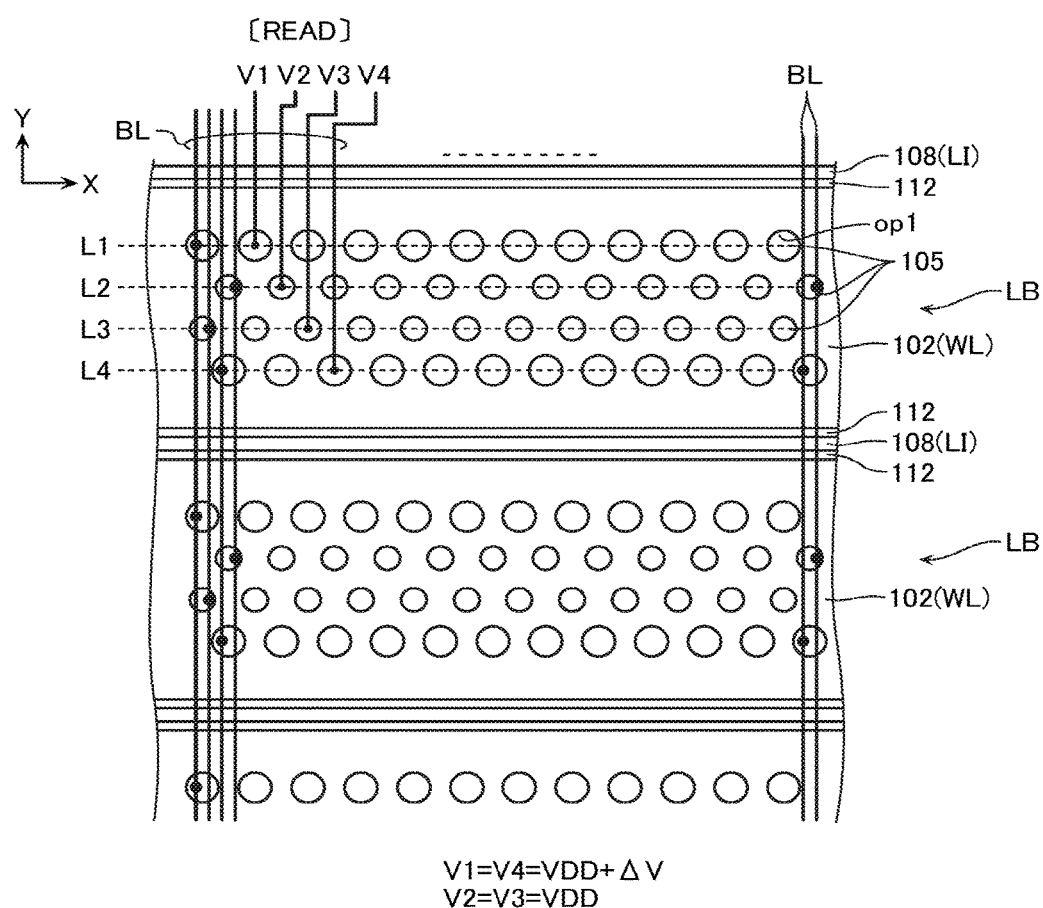
FIG. 23 is a schematic diagram describing an operation of a non-volatile semiconductor memory device according to a fourth embodiment.

The following describes a writing operation of this third embodiment with reference to FIG. 22. Here, a description will be given with an example where there are 24 word lines WL; the word line on the lowermost layer is a word line WL0 and the word line on the uppermost layer is a word line WL23. This number of the word lines WL (24 lines) is merely one example, and needless to say, it is not the gist of limitation.

First, a case of selecting the word line WL23 on the uppermost layer will be described. In this case, the voltages V1, V4, which are applied to the bit line BL connected to the memory shaft 105 in the rows L1 or L4 on the side of the conducting layer 108 and the insulation separating layer 112 within the laminated body LB, are set to 0 V. On the other hand, the voltages V2, V3, which are applied to the bit line BL connected to the memory shaft 105 in the rows L2 or L3 on the side far from the conducting layer 108 and the insulation separating layer 112, are set to ΔVBLC23, which is slightly larger than 0 V. This ΔVBLC is, for example, approximately a value of 0.4 V.

Next, a case of selecting the word line WL0 on the lowermost layer will be described. In this case, the voltages V1, V4, which are applied to the bit line BL connected to the memory shaft 105 in the rows L1 or L4 within the laminated body LB, are set to V0. This voltage of V0 is a larger value than 0 V. On the other hand, the voltages V2, V3, which are applied to the bit line BL connected to the memory shaft 105 in the rows L2 or L3, are set to V0+ΔVBLC0, which is slightly larger than V0. This voltage of ΔVBLC0 is a smaller value than the aforementioned voltage of ΔVBLC23.

Similarly, in a case of selecting a word line WLi (i=1 to 22), which is positioned in between, the difference between the voltages V1, V4, which are applied to the bit line BL connected to the memory shaft 105 in the rows L1 or L4, and the voltages V2, V3, which are applied to the bit line BL connected to the memory shaft 105 in the rows L2 or L3, are set to ΔVBLCi. The value this ΔVBLCi becomes larger as the word line WLi is located in a higher layer.

Thus, according to the third embodiment, the voltages V1 to V4 are varied in consideration of the difference of the selected word line WL as well as the difference of the rows L1 to L4. This achieves an effect identical to the first to the second embodiment, further, the variations of writing characteristics per memory cell can be absorbed even in the laminating direction, thus ensuring the improved writing speed as a whole.

Fourth Embodiment

Next, a semiconductor memory device according to the fourth embodiment will be described with reference to FIG. 24. A configuration of the semiconductor memory device according to this fourth embodiment is approximately identical to the aforementioned embodiments, therefore the overlapped description will be omitted. This fourth embodiment is related to a reading operation. It differs from the aforementioned first to third embodiments on the point that the aforementioned first to third embodiments are related to the writing operation.

As described above, when the diameters of the memory shafts 105 are different in each row within one laminated body LB, the characteristics of the memory cell MC are also different depending on the position of the row (L1 to L4) even for the reading operation. Accordingly, in this fourth embodiment, voltages as described below are applied during the reading operation.

As shown in FIG. 19, during the reading operation, a voltage $V_A$ that has a value intermediate between the upper limit and the lower limit of two threshold voltage distributions E, A is applied to the selected word line WL. A voltage Vread that is larger than the upper limit of the threshold voltage distribution A is applied to the non-selected word line WL. A voltage that can electrically conduct the selection gate transistors STD, STS, for example, the power supply voltage VDD is applied to the selection gate lines SGD, SGS.

In this state, precharge voltages V1, V4, which are applied to the bit line BL connected to the memory shaft 105 in the rows L1 or L4, are set to VDD+ΔV, which is a voltage adding an infinitesimal value of ΔV to the power supply voltage VDD. On the other hand, precharge voltages V2, V3, which are applied to the bit line BL connected to the memory shaft 105 in the rows L2 or L3, are set to the power supply voltage VDD. That is, during the reading operation, the precharge voltages V1, V4 of the bit line BL connected to the memory shaft 105 positioned in the rows L1, L4 is made larger than the precharge voltages V2, V3 of the bit line BL connected to the memory shaft 105 positioned in the rows L2, L3.

The memory shaft 105 positioned in the rows L1, L4 tends to have a decreased ON current during the reading operation because the memory shaft 105 has the large diameter D1, which causes the coupling ratio in each memory cell to be decreased. In view of this, the voltages V1, V4, which are applied to the bit line BL connected to the memory shaft 105 positioned in the rows L1, L4, are made larger than the voltages V2, V3 of the bit line BL connected to the memory shaft 105 positioned in the rows L2, L3 in the embodiment. This can uniform ON current flowing to the memory cell MC, regardless of the variations of the diameter D of the memory shaft 105.

Fifth Embodiment

Next, a semiconductor memory device according to a fifth embodiment will be described with reference to FIG. 24. A configuration of the semiconductor memory device according to this fifth embodiment is approximately identical to the aforementioned embodiments. This fifth embodiment is common to the fourth embodiment on the point that this fifth embodiment also relates to the reading operation. A detailed operation during the reading operation, however, is different from the fourth embodiment.

In the fourth embodiment, the voltage applied to the bit line BL during the reading operation is varied in accordance with the position in the Y direction of the memory shaft 105 including the selected memory cell MC (distance from the conducting layer 108). In the fifth embodiment, in addition to the above, the voltage applied to the bit line BL during the reading operation is varied depending on positions in the Z direction of the selected memory cell or the selected word line WL. As described in FIG. 19, the diameter difference ΔD between the memory shaft 105 in the row L1 and the memory shaft 105 in the row L2 increases toward the upper part of the laminated body LB. The fifth embodiment is intended to reduce the effect caused by changes of this diameter difference ΔD.

Figure 24:
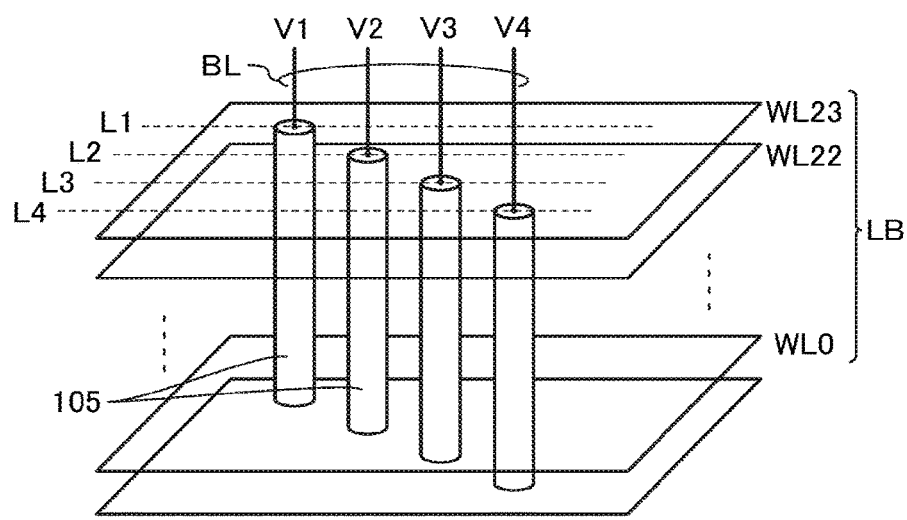
FIG. 24 is a schematic diagram describing an operation of a non-volatile semiconductor memory device according to a fifth embodiment.

The following describes a reading operation of this fifth embodiment with reference to FIG. 24. Here, a description will be given with an example where 24 word lines WL (WL0 to WL23) are disposed; the word line on the lowermost layer is a word line WL0 and the word line on the uppermost layer is a word line WL23. This number of the word lines WL (24 lines) is merely one example, and needless to say, it is not the gist of limitation.

First, a case of selecting the word line WL23 on the uppermost layer (Read@WL23) will be described. In this case, the voltages V1, V4, which are applied to the bit line BL connected to the memory shaft 105 in the rows L1 or L4 on the side of the conducting layer 108 and the insulation separating layer 112 within the laminated body LB, are set to VDD1+ΔVr23, which is a value adding an infinitesimal voltage of ΔV23 to the power supply voltage VDD. On the other hand, the voltages V2, V3, which are applied to the bit line BL connected to the memory shaft 105 in the rows L2 or L3 on the side far from the conducting layer 108 and the insulation separating layer 112, are set to the power supply voltage VDD1. The infinitesimal voltage ΔVr23 here is, for example, approximately a value of 0.2 V to 0.4 V.

Next, a case of selecting the word line WL0 on the lowermost layer will be described. In this case, the voltages V1, V4, which are applied to the bit line BL connected to the memory shaft 105 in the rows L1 or L4 within the laminated body LB, are set to VDD2+ΔVr0, which is a value adding an infinitesimal voltage of ΔVr0 to the power supply voltage VDD2 (VDD2 is a voltage smaller value than VDD1). On the other hand, the voltages V2, V3, which are applied to the bit line BL connected to the memory shaft 105 in the rows L2 or L3 on the side far from the conducting layer 108 and the insulation separating layer 112, are set to the power supply voltage VDD2. The infinitesimal voltage ΔVr0 here is, for example, approximately a value of 0.1 V and a smaller value than the aforementioned ΔVr23.

Similarly, in a case of selecting a word line WLi (i=1 to 22), which is positioned in between, the difference between the voltages V1, V4, which are applied to the bit line BL connected to the memory shaft 105 in the rows L1 or L4, and the voltages V2, V3, which are applied to the bit line BL connected to the memory shaft 105 in the rows L2 or L3, are set to ΔVri. A value of this ΔVri is an intermediate value between ΔVr0 and ΔVr23. The larger value ΔVri becomes larger as the word line WLi is located in a higher layer.

Thus, according to the fifth embodiment, the voltages V1 to V4 are varied in consideration of the difference of the selected word line WL as well as the difference of the rows L1 to L4. This achieves an identical effect to the fourth embodiment, further, the variations of reading characteristics per memory cell can be absorbed even in the laminating direction, thus ensuring the shortened reading time as a whole.

Sixth Embodiment

Figure 25:
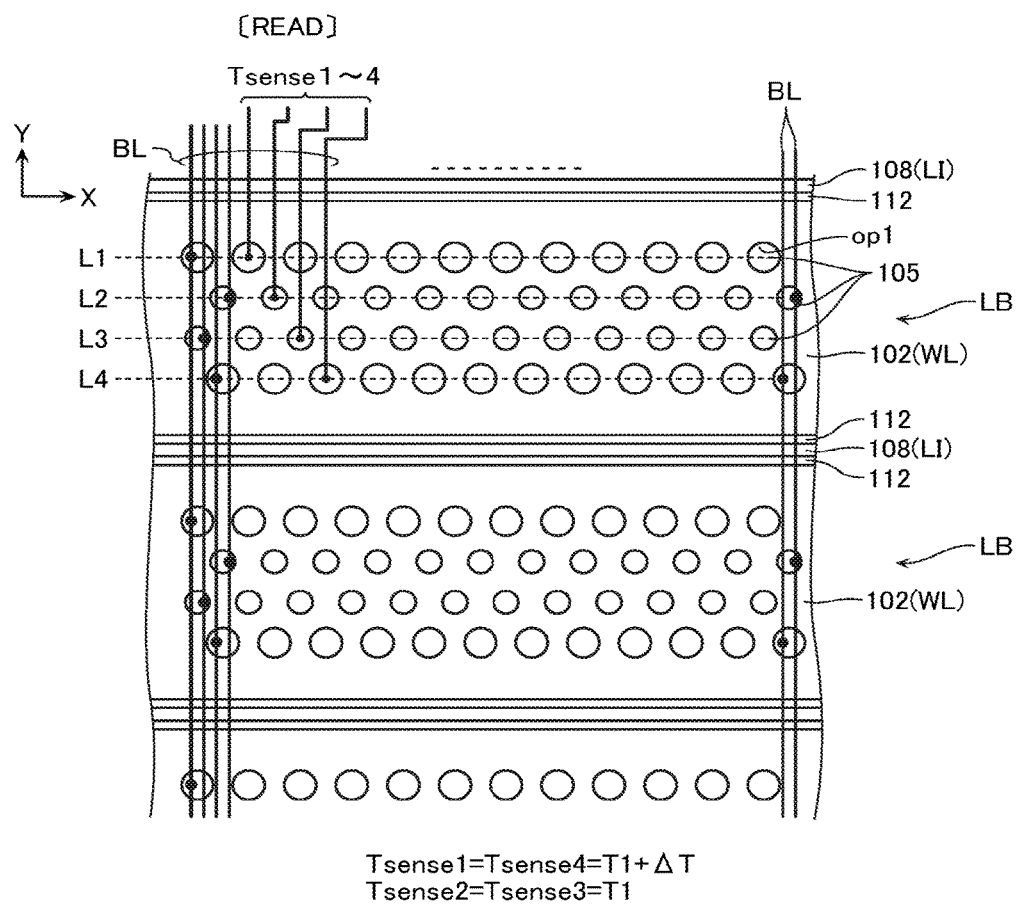
FIG. 25 is a schematic diagram describing an operation of a non-volatile semiconductor memory device according to a sixth embodiment.

Next, a semiconductor memory device according to a sixth embodiment will be described with reference to FIG. 25. A configuration of the semiconductor memory device according to this sixth embodiment is approximately identical to the aforementioned embodiments, therefore the overlapped description will be omitted. This sixth embodiment is common to the fourth to the fifth embodiments on the point that this sixth embodiment relates to the reading operation. In this sixth embodiment, however, is different from the fourth to the fifth embodiments on a point that this sixth embodiment sets a different sensing time Tsense in a different row L, whereas the fourth to the fifth embodiments vary the voltages applied to the bit line BL.

As described above, when the diameters of the memory shafts 105 are different among the rows within one laminated body LB, the characteristics of the memory cell MC are also different depending on the position of the row (L1 to L4) even for the reading operation. Accordingly, in this sixth embodiment, sense times as described below are set during the reading operation. Note that the voltage provided to each wiring during the reading operation is similar to a well-known method.

When the memory shaft 105 in the rows L1 or L4 is the target of the reading operation, reading times (sense time) Tsense1, Tsense4 for reading a cell current are set to T1+ΔT. On the other hand, when the memory shaft 105 in the rows L2 or L3 is the target of reading, reading times to read cell current (sense time) Tsense1, Tsense4 are set to T1. That is, in the reading operation according to this sixth embodiment, the reading times Tsense1 and Tsense4 when targeting the memory shaft 105 positioned in the rows L1, L4 for reading is made longer than the reading times Tsense2 and Tsense3 when targeting the memory shaft 105 positioned in the rows L2, L3 for reading. Such operation is performed because the memory shaft 105 positioned in the rows L1, L4 tends to have the decreased ON current during the reading operation due to the large diameter D1 of the memory shaft 105, which causes the coupling ratio in each memory cell to be decreased. In view of this, setting the reading time as described above can restrain the variations of reading characteristics of the memory cell MC, regardless of the variations of the diameter D of the memory shaft 105, thus ensuring the shortened reading time as a whole.

Seventh Embodiment

Next, a semiconductor memory device according to a seventh embodiment will be described with reference to FIG. 26. A configuration of this seventh embodiment is approximately identical to the aforementioned embodiments. This seventh embodiment is also common to the fourth to the sixth embodiments on the point that this seventh embodiment relates to the reading operation. A detailed operation during the reading operation, however, is different from the sixth embodiment.

In the sixth embodiment, the reading time Tsense during the reading operation is varied in accordance with the position in the Y direction of the memory shaft 105 including the selected memory cell MC (distance from the conducting layer 108). In the seventh embodiment, in addition to the above, the reading time Tsense is varied depending on positions in the Z direction of the selected word line WL.

As described in FIG. 19, the diameter difference $\Delta D$ between the memory shaft 105 in the row L1 and the memory shaft 105 in the row L2 increases toward the upper part of the laminated body LB. The seventh embodiment is intended to reduce the effect caused by changes of this diameter difference $\Delta D$.

Figure 26:
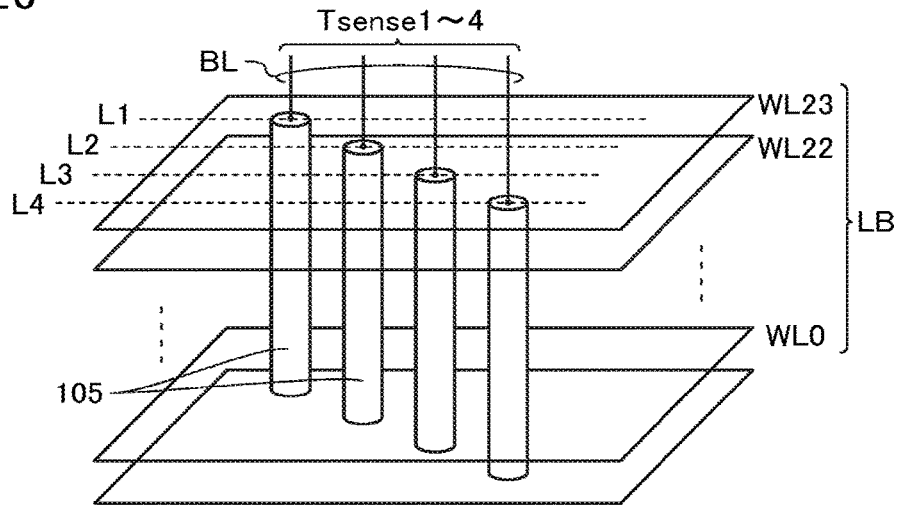
FIG. 26 is a schematic diagram describing an operation of a non-volatile semiconductor memory device according to a seventh embodiment.

The following describes a reading operation of this seventh embodiment with reference to FIG. 26. Here, similar to the aforementioned embodiments, a description will be given with an example where there are 24 word lines WL, the word line on the lowermost layer is a word line WL0 and the word line on the uppermost layer is a word line WL23.

First, a case of selecting the word line WL23 on the uppermost layer (Read@WL23) will be described. In this case, when reading the memory cell included in the memory shaft 105 in the rows L1 or L4 on the side of the conducting layer 108 and the insulation separating layer 112 within the laminated body LB, the reading times Tsense1, Tsense4 are each set to T1+$\Delta$T23. On the other hand, when reading the memory cell included in the memory shaft 105 in the rows L2 or L3 on the side far from the conducting layer 108 and the insulation separating layer 112, the reading times Tsense2, Tsense3 are each set to T1. Thus, the sense time differs by $\Delta$T23 depending on the position of the row L.

Next, a case of selecting the word line WL0 on the lowermost layer will be described. In this case, when reading the memory cell of the memory shaft 105 in the rows L1 or L4 within the laminated body LB, the reading times Tsense1, Tsense4 are each set to T2+$\Delta$T0. On the other hand, when reading the memory cell included in the memory shaft 105 in the rows L2 or L3 on the side far from the conducting layer 108 and the insulation separating layer 112, the reading times Tsense2, Tsense3 are each set to T2. Thus, the sense time differs by $\Delta$T0 depending on the position of the row L. Note that the time $\Delta$T0 here is shorter than the aforementioned time $\Delta$T23.

Similarly, in a case of selecting a word line WLi (i=1 to 22), which is positioned in between, the difference $\Delta$Ti is given in the reading time between when reading the memory cell of the memory shaft 105 in the rows L1 or L4 and when reading the memory cell of the memory shaft 105 in the rows L2 or L3. The value $\Delta$Vri becomes larger as the word line WLi is located in a higher layer.

Thus, according to the seventh embodiment, the value of the reading time Tsense is varied in consideration of the difference of the selected word line WL as well as the difference of the rows L1 to L4. This achieves an identical effect to the sixth embodiment, further, the variations of reading characteristics per memory cell can be absorbed even in the laminating direction, and thus ensuring the shortened reading time as a whole device.

Other Embodiments

The above-described embodiments showed an example where the memory shafts 105 are formed in four rows within one laminated body LB separated with the isolation insulating grooves where the conducting layers 108 (source contact LI) are formed. This is merely one example, and the number of rows of the memory shafts 105 included within one laminated body LB is not limited to four.

Figure 27:
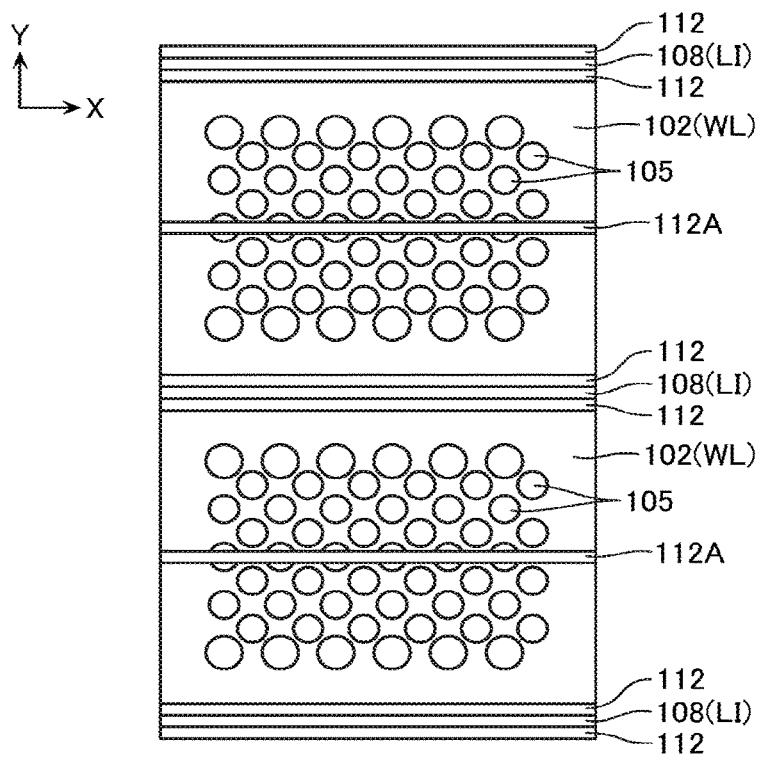
FIG. 27 illustrates a modification of the embodiments.

According to the above-described embodiment, in one laminated body LB, every conducting layer 102 is connected to every memory shaft 105, which is included within one laminated body LB. However, the embodiment is not limited to this. For example, as shown in the modification in FIG. 27, insulation separating layers 112A (second insulation separating layer) that separate only the drain side selection gate lines SGD may be disposed in one laminated body LB in addition to the insulation separating layers 112 that reach the substrate 101. In this modification in FIG. 27, one laminated body LB includes the memory shafts 105 disposed in nine rows L1 to L9.

Among these nine rows, the aforementioned insulation separating layer 112A is formed in the position of the memory shaft 105 in the fifth row in the middle, and the insulation separating layer 112A is disposed to overlap the position of the memory shaft 105 in the fifth row. That is, among the memory shafts 105 of nine rows, the memory shafts 105 in the first to the fourth and the sixth to the ninth rows actually serves as memory cells while the memory shafts 105 in the fifth row do not serve as memory cells within one laminated body LB according to this modification.

Even in this example, the diameter of the memory shaft 105 in the first row or the ninth row is larger than the diameter of the memory shaft 105 positioned inner side with respect to the first row and the ninth row (the second to the fourth rows, the sixth to the eighth rows). In view of this, even in this modification, the operations similar to the above-described embodiments can be executed.

Others

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a laminated body including a plurality of control gate electrodes laminated in a first direction, and having longitudinally a second direction intersecting with the first direction;
   an insulation separating layer arranged along the laminated body and having longitudinally the second direction;

a plurality of semiconductor layers having longitudinally the first direction, having a peripheral area surrounded by the plurality of control gate electrodes, and arranged in a plurality of rows within the laminated body;

a memory insulating layer disposed between the control gate electrodes and one of the semiconductor layers, and including an electric charge accumulating layer;

a plurality of bit lines connected to one ends of the semiconductor layers, respectively, the plurality of bit lines extending in a third direction intersecting with the first and second directions; and a controller that controls a voltage applied to the control gate electrodes and the bit lines, wherein a width of the semiconductor layer positioned in a first row closer to the insulation separating layer with respect to a cross-sectional surface along the second direction or the third direction is larger than a width of the semiconductor layer positioned in a second row positioned further from the insulation separating layer than the first row with respect to a cross-sectional surface along the second direction or the third direction, and the controller, during a writing operation, applies a first voltage to a first bit line connected to the semiconductor layer positioned in the first row, and applies a second voltage larger than the first voltage to a second bit line connected to the semiconductor layer positioned in the second row, among the plurality of rows.

2. The semiconductor memory device according to claim 1, wherein a position in the second direction of the semiconductor layer positioned in the first row is different from a position in the second direction of the semiconductor layer positioned in the second row.

3. The semiconductor memory device according to claim 1, wherein the insulation separating layer includes:

a first insulation separating layer reaching a substrate from an upper side of the laminated body; and a second insulation separating layer separating only a part of the plurality of control gate electrodes from the upper side of the laminated body.

4. The semiconductor memory device according to claim 3, wherein the plurality of control gate electrodes include control gate electrodes of:

a plurality of memory cells constituting a memory string;

a first selection gate transistor connected to a first end portion of the memory string; and a second selection gate transistor connected to a second end portion of the memory string, and the second insulation separating layer separates only the control gate electrode of the first selection gate transistor.

5. The semiconductor memory device according to claim 1, wherein the controller sets a difference between the first voltage and the second voltage to a varied value depending on a position in the first direction of a selected memory cell.

6. The semiconductor memory device according to claim 1, wherein the controller sets the first voltage to a first value while setting the second voltage to a value larger than the first value, during a first phase of the writing operation; and sets the first voltage to a second value smaller than the first value while setting the second voltage to a value larger than the second value, during a second phase of the writing operation.

* * * * *